(12) United States Patent
Jin

(10) Patent No.: US 6,628,221 B2
(45) Date of Patent: Sep. 30, 2003

(54) SIGNAL AMPLIFYING METHOD, SIGNAL AMPLIFIER AND DEVICES RELATED THEREWITH

(76) Inventor: Ok-Sang Jin, 12-304, Woosin Apt., San 70-1, Hwagok5-Dong, Gangseo-Gu, Seoul 157-797 (KR)

( * ) Notice: Subject to any disclaimer, the term of this patent is extended or adjusted under 35 U.S.C. 154(b) by 0 days.

(21) Appl. No.: 10/137,928

(22) Filed: May 1, 2002

(65) Prior Publication Data

US 2002/0163458 A1 Nov. 7, 2002

(30) Foreign Application Priority Data

May 4, 2001 (KR) .......................................... 2001-24301
Dec. 31, 2001 (KR) .......................................... 2001-88780

(51) Int. Cl.[7] .............................................. H03M 1/82
(52) U.S. Cl. ........................................ 341/152; 341/144
(58) Field of Search ................................ 341/152, 144; 375/238

(56) References Cited

U.S. PATENT DOCUMENTS 4,228,464 A * 10/1980 Duijkers ...................... 348/637
4,580,064 A * 4/1986 Varnovitsky ................. 327/172
5,784,689 A * 7/1998 Kobayashi .................... 455/126

* cited by examiner

Primary Examiner—Peguy Jeanpierre
(74) Attorney, Agent, or Firm—Brown Martin Haller & McClain LLP

(57) ABSTRACT

An analog signal amplifying method, an amplifier to output a first pulse of high level by comparing an input signal with a first sawtooth-wave having an amplitude greater than that of the input signal and determining that the first sawtooth-wave is greater than the input signal; to output a narrower second pulse of one short type at every starting point of the high region of the first pulse; to continuously extract an output voltage by corresponding the second sawtooth-wave having a period identical to that of the first sawtooth-wave with a high point of the second pulse and sampling the second sawtooth-wave voltage positions at the corresponded parts; to change the extracted voltage to a condenser by a high speed switch to maintain it constant; and to eliminate a valley of a waveform, thereby performing a convenient filtering process, whereby the invention can obtain good linearity of the first sawtooth-wave very easily, with neither restrictions to an input voltage range nor use of a negative feedback, to thereby basically solve the distortion problem caused by the time delay, easily perform a filtration without any deformations in the waveform due to a lower rate of a high frequency containing component that results in little distortion. And the digital signal is directly connected to the amplifier of the invention without a D/A conversion unit in the contemporary digital reviving device (for instance, CDP), so that it is realized to effectively reproduce signals without any deformation in shape and it is relatively possible to further simplify the structure of the circuit.

22 Claims, 18 Drawing Sheets

POWER AMPLIFICATION DEVICE (CBST1)

SIGNAL AMPLIFYING METHOD, SIGNAL AMPLIFIER AND DEVICES RELATED THEREWITH

BACKGROUND OF THE INVENTION

1. Field of the Invention

The present invention relates to an analog signal amplifying method in the field of a digital amplifier and more particularly to an analog signal amplifying method that restrains the distortion degree of output waveform to significantly improve output of audio amplifier or the like. Also, the present invention relates to an integrated circuit of an amplification device made by using such an amplifying method. Furthermore, the present invention relates to an amplifier that utilizes various digital data signals like pulse width modulation (PWM) signals or pulse code modulation (PCM) signals as input signals. And finally, the present invention relates to a sawtooth-wave oscillator and a power amplification device used for a variety of amplifiers.

2. Brief Description of the Prior Art

In general, an amplification device of an audio amplifier has mostly been made of transistors. However, there have been critical problems in the general amplification devices using transistors in that the magnitude of allowable input bias voltage thereof (generally called base voltage) is relatively lower (generally, less than 0.6 V). In other words, in the case of transistors, a desired value of an output (generally, collector current or voltage) can be properly obtained only when the base input voltage is less than the allowable input voltage. However, there may be a significant waveform distortion when the base input voltage is over 0.6 V. FIG. 3a illustrates a normal output of transistors when the base input voltage is less than 0.6 V (In the drawing, the curve corresponds to a waveform of an output current. But when load resistance is connected with the amplification device, the output current transforms into output voltage corresponding thereto). FIG. 3b illustrates waveform distortion of an output signal when the base input voltage is over 0.6 V.

In order to solve the problem like the aforementioned waveform distortion of a desired output caused by unbalance of the input bias voltage, there has been a method of compensating an input bias voltage by letting some part of the output signals in reverse phase go back to the input through a negative feedback circuit. However, this method has another problem in that the input waveform compensated by feedback of output results in distortion due to a time delay (Td) for passing through the negative feedback circuit (shown in FIG. 4c), and therefore, the resultant output waveform also has distortion. FIGS. 4a and 4b are typical examples of amplifiers that compensate the input bias voltage. FIG. 4c illustrates a distortion type of an input waveform in which an input waveform and a negative feedback waveform are combined and a distortion type of an output waveform corresponding to the distortion type of the input waveform. In case of the amplifier circuits using the negative feedback compensation method, the numbers of amplification stages are relatively larger because of the lower gain degree thereof and the degree of waveform distortion in output side increase in proportion to the number of amplification stages.

Meanwhile, a field effect transistor (FET) having a gate voltage of about 1.5 V can be utilized as a means for compensating the narrower range of bias input voltage of a transistor. However, FET has been used only for a few particular circuits because of its operational instability affected by a temperature change and its own characteristic error.

A conventional vacuum tube amplifier has a bias voltage of over 1.5 V and a big amplification gain, so that it has a small number of amplification stages. Since there is little distortion of cross modulation in the audio amplifying circuit using a vacuum tube, it can be frequently witnessed that professional music specialists appreciate music with a vacuum tube amplifier. In spite of such an advantage, the vacuum tube amplifier has lost its practicality at present because of the its disadvantages such as high power consumption, large bulkiness in size, deterioration in sound quality and higher costs in manufacturing and maintenance.

On the other hand, there is an audio amplifier called a "class-D amplifier" of digital circuit using a pulse width modulation (PWM) method that keeps the merits but compensates the demerits of the aforementioned vacuum tube. FIG. 5 illustrates an instance of a "class-D amplifier." As shown in FIG. 5, the class-D amplifier has a sawtooth-wave oscillator built-in on it. A comparator COMP6 compares sawtooth-wave voltage W1 with input signal Vi6 and determines an output W2 as HIGH while the input signal Vi6 is higher than the sawtooth-wave voltage W1 (Refer to Q in FIG. 6). The square-waves have pulse widths which have been converted In response to the change in magnitude between the input signal and sawtooth-wave (PWM modulation). An output (W2) of the aforementioned comparator switches MOSFET at an output terminal (W3) (refer to solid line shown in FIG. 6). At this time, the output signal (W3) is a square-wave resulting from ON/OFF switching of supply voltage supplied to the output terminal, so that it contains a lot of harmonic waves and its duty rate changes according to the magnitude of an input voltage. The output signal (W3) has a higher level of average voltage if an ON signal has a big width, but has a lower level of average voltage if the ON signal has a small width (refer to dotted line shown in FIG. 6). The output signal (W3) is passed to a low pass filter (LPF) for integration. The harmonic waves are eliminated to obtain the resultant analog output signal (Refer to S shown in FIG. 6).

However, there have been problems in the "class-D amplifier" in that LC filter should be connected in multi-stages to smoothen the output signal, square-wave (that is, to eliminate elements of a harmonic wave), thereby resulting in a large bulkiness of coils and requiring advanced skill for shutting off electronic waves emitted from the outside. Also, there Is still another problem in the "class-D amplifier" in that the sawtooth-wave oscillation frequency should be raised to the maximum level of frequency that can switch MOSFET for a high level of sound quality, thereby requiring advanced filtering and switching skills.

SUMMARY OF THE INVENTION

It is an object of the present invention to solve the aforementioned problem and provide a simple and easily manufactured analog signal amplifying method, which eliminates the distortion of an output waveform to generate the resultant output similar to an original sound or original analog signal but needs neither multi-step filters to have only a small bulkiness in size nor advanced filtering and switching skills. It is also an object of present invention to provide an amplification device integrated with a semiconductor using the analog signal amplifying method.

It is another object of the present invention to provide an amplifier to input digital data signals such as PWM signals in a combination of digital device such as a modernized CDP or the like and a power amplifier to solve a lot of problems occurring at the D/A conversion step by omitting an intermediate D/A conversion process but directly connecting digital data.

It is still another object of the present invention to provide a sawtooth-wave oscillator to be used for the amplifier or amplification device.

It is further another object of the present invention to provide a power amplification device to be used for the amplifier or amplification device.

In order to accomplish the aforementioned object of the present invention, there is provided an analog signal amplifying method of an analog signal amplifier in accordance with a first characteristic structure, the method comprising the steps of;

outputting a first sawtooth-wave having a frequency much larger than a maximum frequency of input signal of the amplifier, an amplitude identical to or a little larger than a maximum amplitude of the input signal and a predetermined period;

comparing the first sawtooth-wave with the input signal to output a first pulse of high level while amplitude of the first sawtooth-wave is larger than that of the input signal;

outputting a second pulse having a small width in the form of one short type at every starting point of high level region of the first pulse;

outputting a second sawtooth-wave having an amplitude identical to or a little larger than a maximum amplitude of output signal of the amplifier and the same period and phase as that of the first sawtooth-wave;

corresponding the respective starting points of high level regions of the second pulse to the second sawtooth-wave to continuously generate an output voltage on the basis of the second sawtooth-wave voltage positions where the starting points and the high level regions are corresponded with each other; and charging the generated voltage into a condenser by a high speed switch, keeping constantly the charged voltage In it and eliminating a valley of the output waveform to be easily filtered.

In order to accomplish the aforementioned object of the present invention, there is provided an analog signal amplifying method of an analog signal amplifier in accordance with a second characteristic structure, the method comprising the steps of:

outputting a first sawtooth-wave having a frequency much larger than a maximum frequency of the input signal of the amplifier, an amplitude identical to or a little larger than a maximum amplitude of the input signal and a predetermined period;

comparing the first sawtooth-wave with the input signal to output a first pulse of high level while the amplitude of the first sawtooth-wave is larger than that of the input signal;

outputting a second pulse having a small width in the form of one short type at every starting point of high level regions of the first pulse;

outputting a second sawtooth-wave having an amplitude identical to or a little larger than a maximum amplitude of output signal of the amplifier and the same period and phase as that of the first sawtooth-wave;

corresponding the respective starting points of high level regions of the second pulse to the second sawtooth-wave to continuously generate a first output voltage on the basis of the second sawtooth-wave voltage position where the starting points and the high level regions are corresponded with each other;

outputting a third sawtooth-wave having reversed phase of the second sawtooth-wave;

corresponding the respective starting points of high level regions of the second pulse to the third sawtooth-wave to continuously generate a second output voltage on the basis of the third sawtooth-wave voltage position where the starting points and the third sawtooth-wave are corresponded with each other;

charging the first and second generated voltage into a condenser by an analog switch, constantly maintaining the voltage charged in it and eliminating valleys of the output waveforms to be easily filtered; and obtaining a double magnitude of output signal by utilizing the first and second outputs.

In order to accomplish the aforementioned object of the present invention in accordance with a third characteristic structure, as defined in the first or second characteristic structure, there is additionally provided a method including a step of adjusting gain of an amplifier by adjusting the amplitude of the first sawtooth-wave.

In order to accomplish the aforementioned object of the present invention in accordance with a fourth characteristic structure, as defined in the first or second characteristic structure, there is additionally provided a method including a step of modulating the amplitude of the input signal by adjusting the amplitude of the first sawtooth-wave through a second input signal apart from the input signal.

Furthermore, it is an object of the present invention to provide an amplification device integrated with a semiconductor using the first through fourth characteristic structures.

BRIEF DESCRIPTION OF THE DRAWINGS

The objects and aspects of the invention will become apparent from the following description of preferred embodiments with reference to the accompanying drawings in which:

FIG. 2b is an enlarged, perspective view for illustrating a corresponding relationship between input and output signals of the waveform shown in FIG. 2a;

DETAILED DESCRIPTION OF THE INVENTION

Hereinafter, the preferred embodiments of the present invention will be described with reference to the accompanying drawings.

Figure 1:
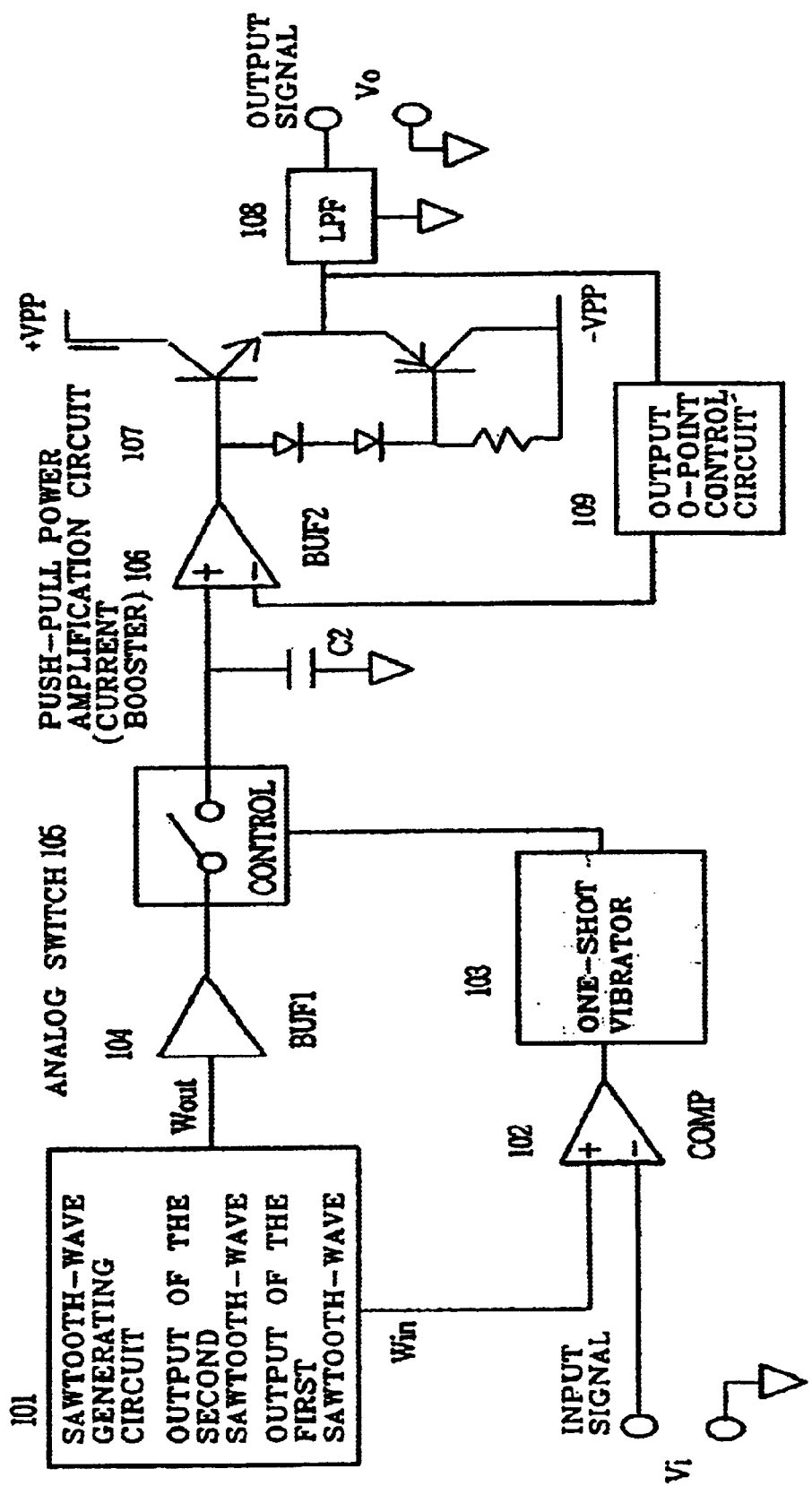
FIG. 1 is a schematic view for illustrating an embodiment of an analog signal amplifier in accordance with the present invention.

FIG. 1 is a schematic view for illustrating an embodiment of an analog signal amplifier in accordance with the present invention. The sawtooth-wave signal generated from a sawtooth-wave generating circuit 101 has a much higher frequency than a maximum frequency of an input signal. It is a sawtooth-wave of good linearity with a predetermined period, outputted at two levels. One level of the sawtooth-wave signal is outputted as a first sawtooth-wave Win, a little greater than the maximum peak voltage of an input signal and inputted as a non-inverting input (+). The other level of the sawtooth-wave signal is outputted as a second sawtooth-wave Wout voltage, a little greater than a maximum amplitude necessary for an output signal. And if an analog switch 105 (or a high speed switch, in this specification, the analog switch functions as a high speed switch in actuality) is turned ON by the first buffer amplifier (BUF1) 104, said other level of sawtooth-wave signal is converted into an electric power sufficient enough to charge C2 swiftly and connected as an input for the analog switch 105.

An input signal Vi is inputted to an inversion input (−) of a comparator (COMP) 102 and the first sawtooth-wave Win is connected to the non-inverting input (+). Then, the two signals are compared with each other in the comparator 102 to finally output the first pulse therefrom, as a PWM modulated signal, the pulse width of which is changed depending upon the magnitude of the input signal. The first pulse coming out of the comparator 102 is applied to a trigger input of a one-shot vibrator 103 and converted into a narrow, constant pulse at a position, where a pulse of the input PWM signal starts, to thereby output the second pulse from the one-shot vibrator 103. The output second pulse is applied to a control terminal of an analog switch 105 to turn ON the analog switch 105 during the pulse period thereof. The output of the analog switch 105 is connected to a non-inverting input (+) of the second buffer amplifier BUF2 to drive a push-pull power amplification circuit 107. At the same time the condenser C2 is also connected to the output of the analog switch 105 to charge voltage of the first buffer amplifier 104 when the analog switch 105 is turned ON or to maintain its level of voltage even when the analog switch 105 is turned OFF. The non-inverting terminal (−) of the second buffer amplifier 106 is connected to an output of an output 0-point control circuit 109 that controls to make the output terminal of the push-pull power amplification circuit 107 identical to a common ground voltage at all time. The output of the second buffer amplifier 106 is connected to the push-pull power amplification circuit 107 and the output of the push-pull power amplification circuit 107 is connected with input of the output 0-point control circuit 109 and input of the LPF 108. An output of the LPF 108 is connected to the output terminal Vo again.

The circuit of the present invention thus constructed is called "class-E amplifier or Jin amplifier." "Jin" is the surname of the inventor of the present invention.

Next, the operation of the class-E amplifier, that is, Jin amplifier, will be described with reference to FIGS. 1 through 2 in accordance with the present invention.

The analog input signal Vi and the first sawtooth-wave Win are compared with each other in the comparator 102 (A in FIG. 2a) to generate the first pulse (B in FIG. 2a) having high status while the level of the sawtooth-wave Win is higher than that of the input signal Vi and low status while the level of the sawtooth-wave Win is lower than that of the input signal Vi. The first pulse is supplied to an input of the one-shot 103 to be formed into a second pulse ⓒ in FIG. 2a) having narrow width at the position where the first pulse starts. The width of the second pulse should correspond to a time sufficient to charge a condenser C2 after the analog switch 105 is turned ON. In the aforementioned operation, the voltage of the analog input signal Vi and voltage of the first sawtooth-wave Win at its rising region RAMP are compared with each other to calculate and convert the changes in the voltage of the input signal into the changes in time. At this time, the changes in time generate when the position of the second pulses are changed in the rising regions RAMP of the first sawtooth-wave. In other words, the second pulses are generated at the positions close to the starting point of the sawtooth-wave if the voltage of the input signal is lower, but far from the starting point of the sawtooth-wave if the voltage of the input signal is higher. That is, the magnitude of the input signal Vi and the position of generating the second pulse are in a constant inter-relationship.

The second sawtooth-wave has a period identical to that of the first sawtooth-wave and a maximum magnitude of amplitude required for an output signal. The second sawtooth-wave is supplied to an input of the analog switch 105. The second pulse controls the control terminal of the analog switch 105 to turn ON/OFF the analog switch 105. The analog switch 105 is turned ON only during the duration of generating the second pulse to extract the voltage of the second sawtooth-wave (refer to the small circle mark at D in FIG. 2a) (operation 2).

Figure 2A:
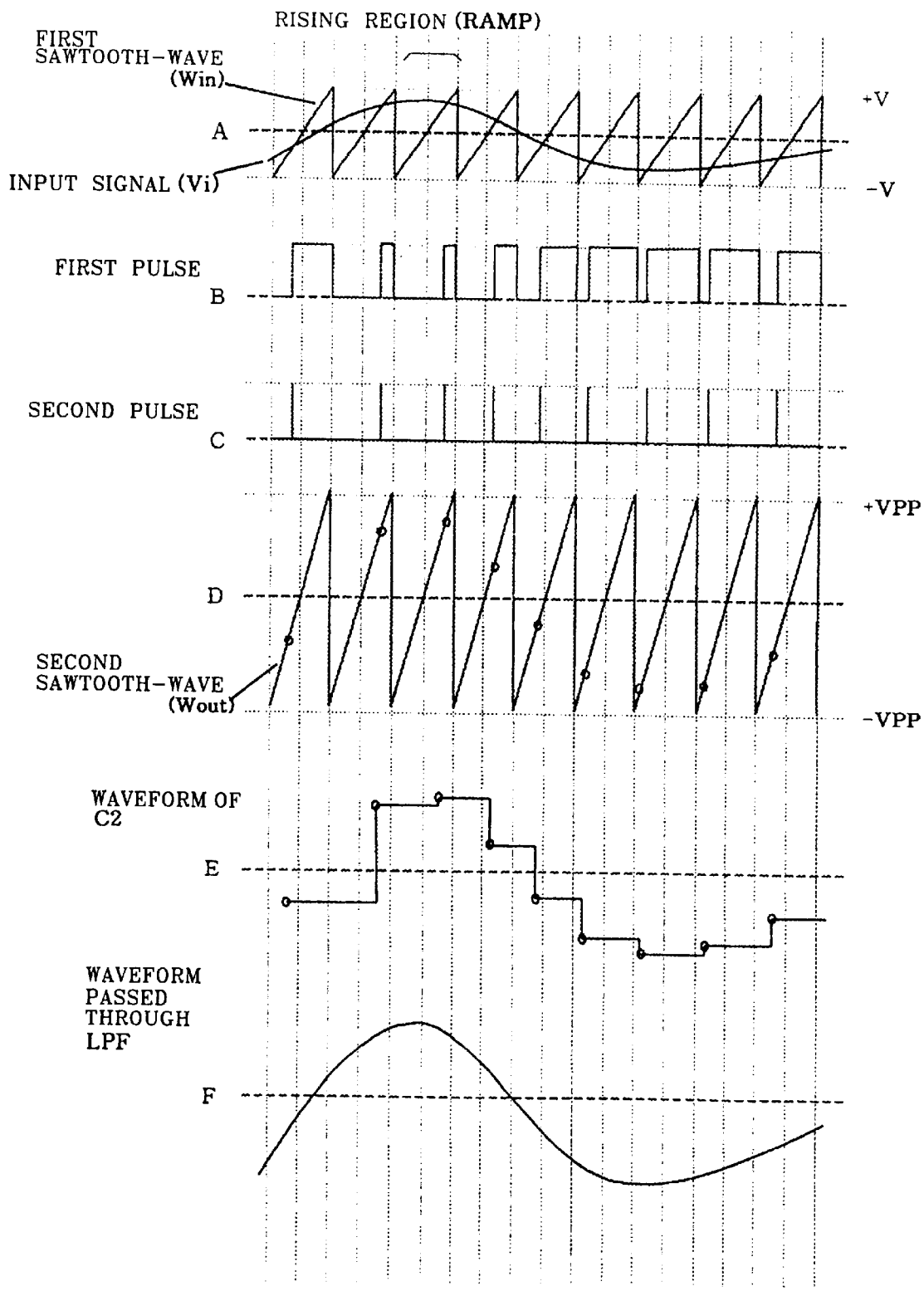
FIG. 2a illustrates waveforms of an amplifier at respective steps.
Figure 2B:
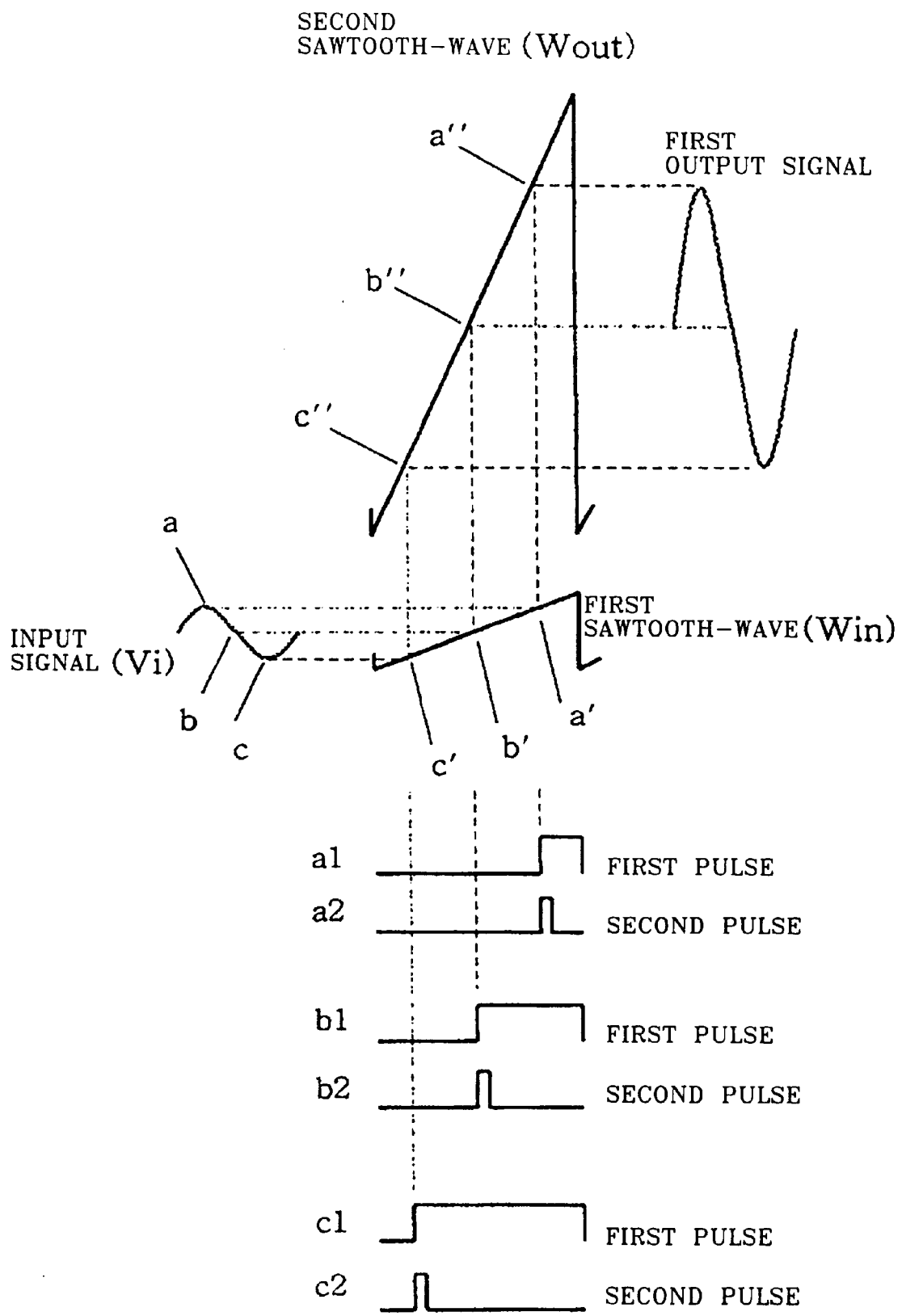

With reference to FIG. 2b, the processes of generating an input signal Vi and an output signal will be described. As shown in FIG. 2b, if input signal Vi is in position a, the first sawtooth-wave Win rises and passes through a', the comparator 102 generates the first pulse a1 and the one-shot vibrator 103 forms it into a narrow width of the second pulse a2. As a result, the formed second pulse is supplied to a control terminal of the analog switch 105 to charge the voltage a" of the second sawtooth-wave Wout to a condenser C2. Next, if the input signal Vi gets down to be at position b, when the first sawtooth-wave Win rises and passes through b', the comparator 102 generates the first pulse b1 and the one-shot vibrator 103 forms it into a narrow width of the second pulse b2. As a result, the formed second pulse is supplied to a control terminal of the analog switch 105 to charge the voltage b" of the second sawtooth-wave Wout to a condenser C2.

Then, if the input signal Vi gets down to be at position c, when the first sawtooth-wave Win rises and passes through c', the comparator 102 generates the first pulse c1 and the one-shot vibrator 103 forms it into a narrow width of the second pulse c2. As a result, the formed second pulse is supplied to a control terminal of the analog switch 105 to charge the voltage c" of the second sawtooth-wave Wout to a condenser C2.

The voltage produced through from operation 2 is charged to the condenser C2. The charged voltage is kept at the condenser C2 until next time of charge (E in FIG. 2a). The voltage charged at the condenser C2 drives the push-pull power amplification circuit 107 via the second buffer amplifier BUF2. Also, if necessary, an LPF, for instance, may be connected to the second buffer amplifier 106.

The push-pull power amplification circuit 107 is a power amplifier to drive load, generally using a class AB amplification circuit. The LPF 108 of the output terminal is used to eliminate components of a high frequency and output only audio signals by integrating the waveforms of the voltage of the condenser C2 which are similar to the square-wave shown as E in FIG. 2a.

During the conversion process mentioned above, it is possible to amplify the voltage level of the input signal Vi into that of output signal Vo by generating the second pulses as the changes in time in proportion to input signals on the basis of the first sawtooth-wave of a good linearity, extracting voltages corresponding to the second pulse generating positions from the second sawtooth-wave having the same maximum amplitude as that of the output signal and charging the extracted voltages to the condenser C2, and power-amplifying the aforementioned voltage at the push-pull power amplification circuit 107 and outputting it.

At this time, the amplification degree A of the amplifier will be described with the following formula:

Formula 1

A=[second sawtooth-wave amplitude/first sawtooth-wave amplitude]

In other words, the amplification rate is determined by the ratio between the first sawtooth-wave amplitude and the second sawtooth-wave amplitude. As shown in the left side of FIG. 2d, when the amplitude of the first sawtooth-wave Win1 is smaller, the output signal corresponding to the first sawtooth-wave gets relatively larger to result in a higher amplification degree. As shown in the right side of FIG. 2d, when the amplitude of the first sawtooth-wave Win2 is larger, the output waveform corresponding to the second sawtooth-wave is relatively smaller to result in a lower amplification degree. That is, the magnitude of the upper and lower amplitude of the first sawtooth-wave and the amplification degree are in an inversely proportional relationship with each other.

Figure 2C:
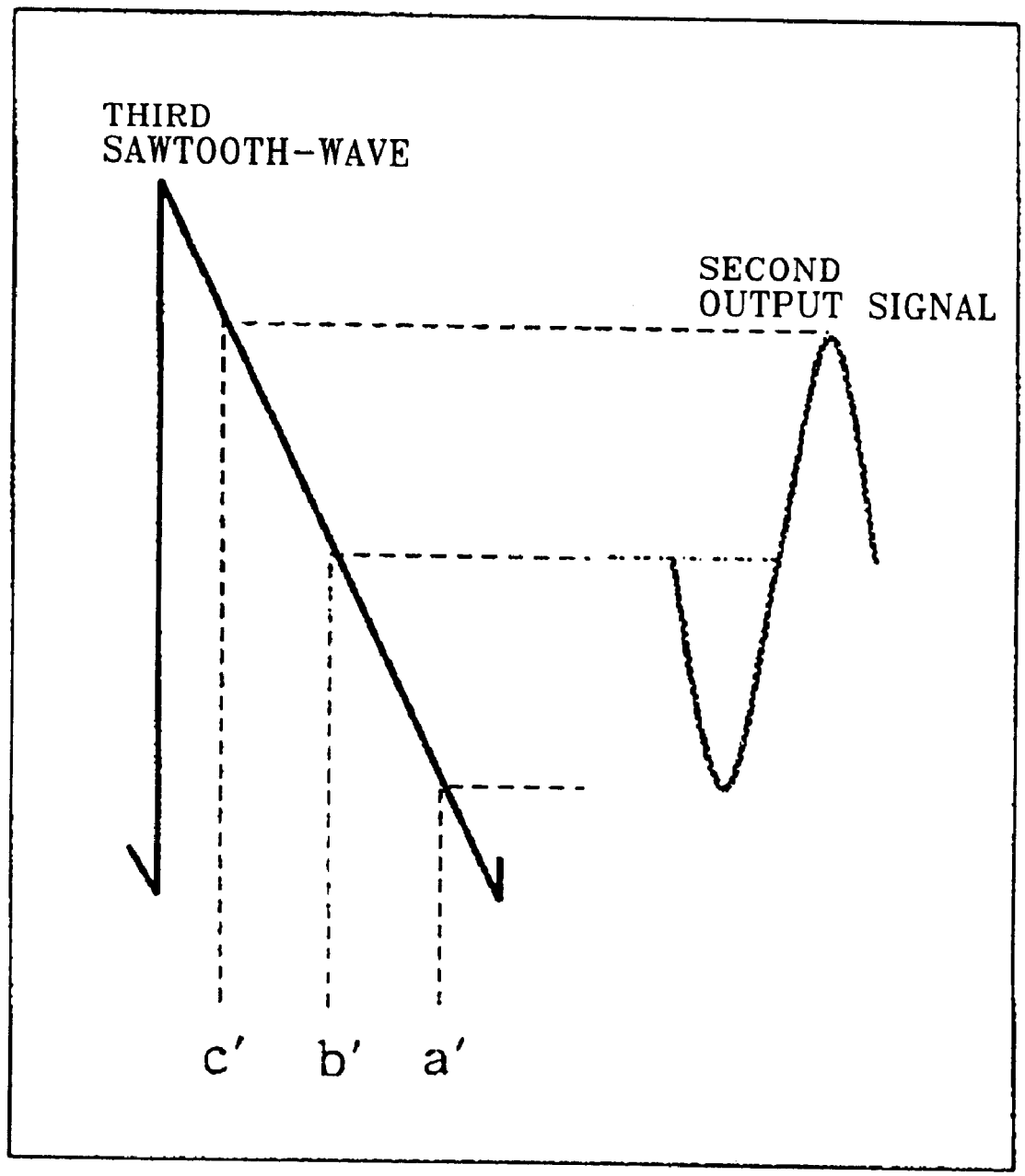
FIG. 2c illustrates a relationship of a reverse phase between an input signal and a second sawtooth-wave when the output signal has been increased twice as much as its original amplitude.
Figure 2D:
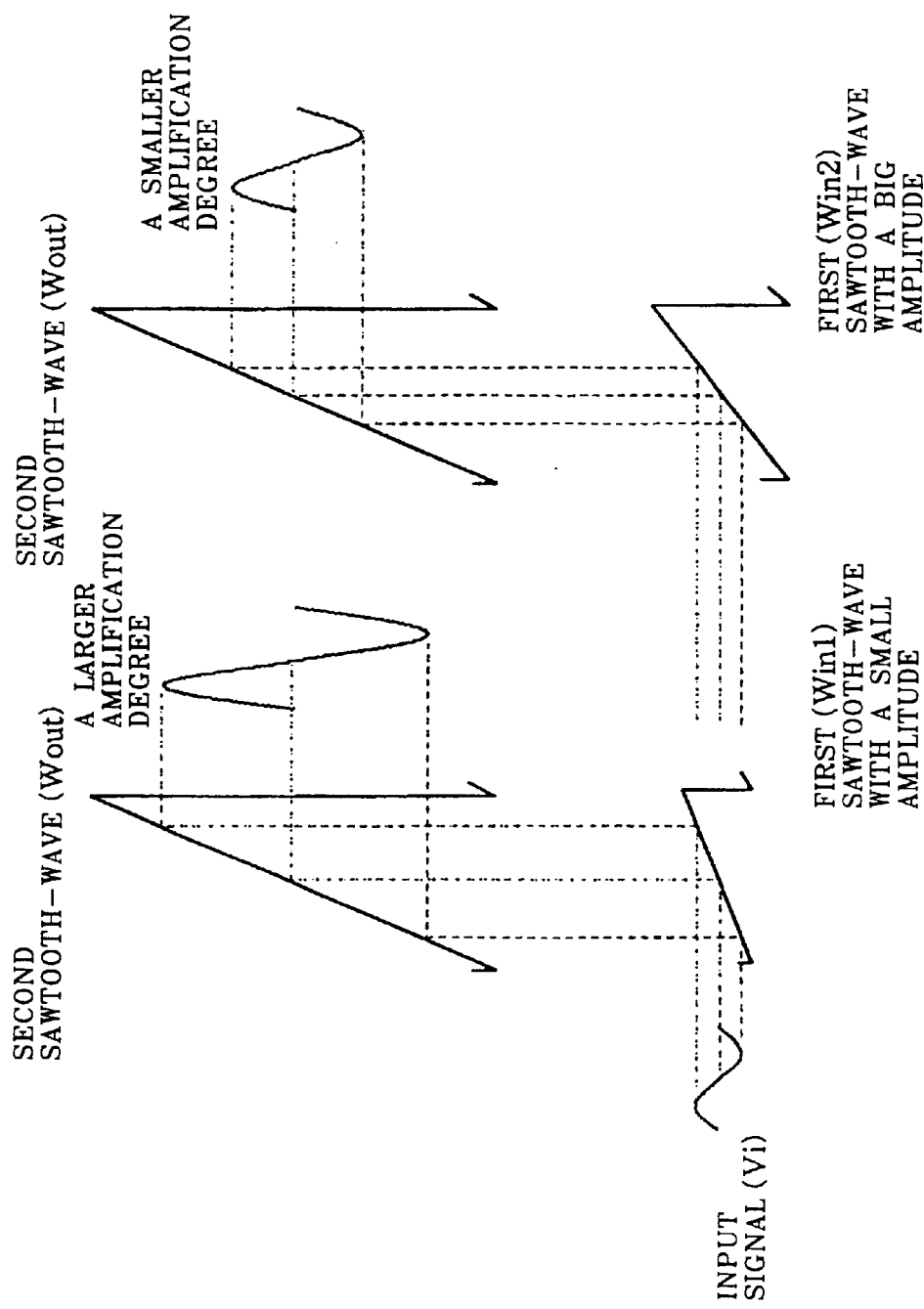
FIG. 2d illustrates changes in the amplification degree of an output signal according to changes in amplitude of a first sawtooth-wave.
Figure 2E:
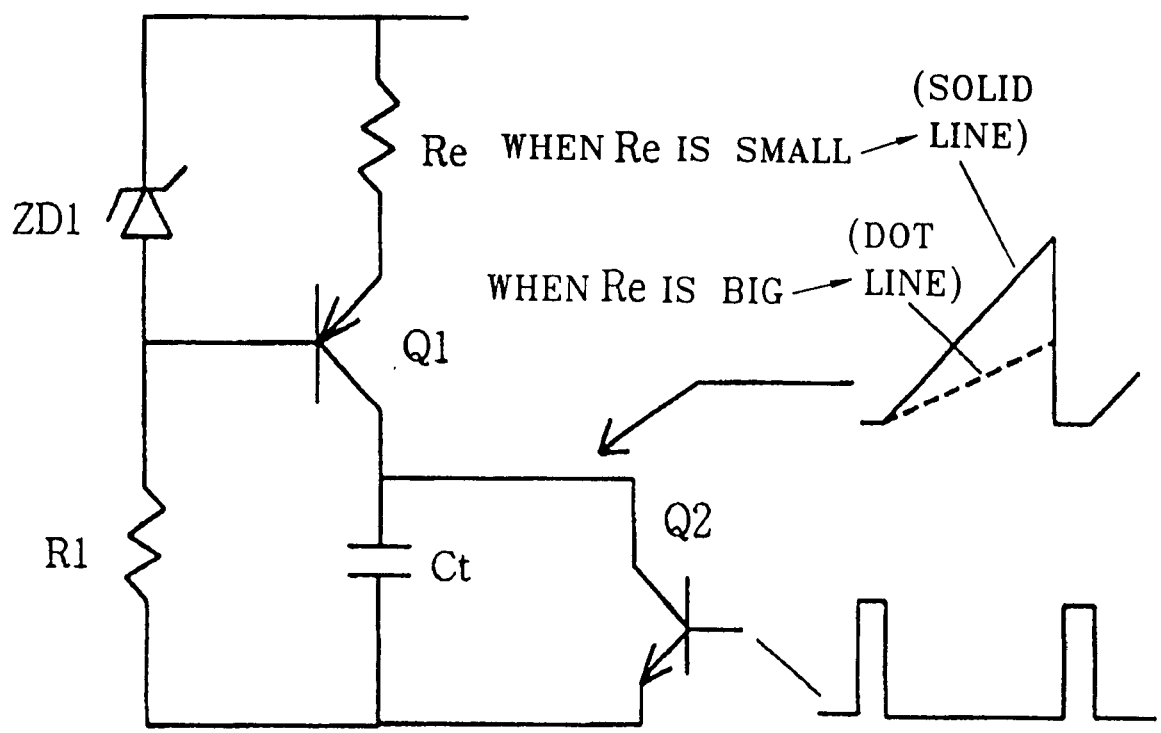
FIG. 2e illustrates an embodiment of a sawtooth-wave oscillator circuit.

FIG. 2e illustrates an embodiment of a circuit for adjusting the magnitude of the amplitude of the first sawtooth-wave. As shown in FIG. 2e, the value of an emitter resistance at Q1 is varied to accordingly change the current value of a constant-current circuit. The time for charging the condenser is varied according to the change in current value for adjusting the amplitude of the first sawtooth-wave. Accordingly, the gain of the amplifier can be adjusted through addition or subtraction in the amplitude of the first sawtooth-wave (which corresponds to changing and adjusting the slopes of the sawtooth-wave). Such an adjustment function relates to controlling the volume degree of an audio device, for instance, in appearance.

As shown in FIG. 2c, a third sawtooth-wave may be created by reversing the phase of the second sawtooth-wave and the voltage corresponding to the second pulse can be extracted from the third sawtooth-wave to obtain the reversed output. Twice the output voltage can be obtained when the non-inverted first output wave and inverted second output are amplified in power thereof to drive the load such that it is easy to construct a bridge tied load (BTL) amplifier.

As described above, in the present invention, the input signal Vi and the first sawtooth-wave Win are compared with each other by the comparator COMP 102 to generate first pulses (operation 3) and form them into second pulses. The voltages corresponding to the second pulses generating positions are extracted from the second sawtooth-wave (operation 4), charged to the condenser C2 and power-amplified by the push-pull power amplification circuit 107 (operation 5) to result in output Vo. Operation 3 as conversion process allows the structure of a circuit having a good linearity of sawtooth-wave. As a result, operation 3 has an advantage of eliminating distortion in the cross modulation; operation 4 utilizes the second pulse generated in operation 3 for an output; the push-pull power-amplification circuit 107 can be used as known general circuit in application. The amplification degree of the push-pull power-amplification circuit 107 is 1, so that there is few problems in light of the input bias voltage characteristic of a transistor. Since the present invention does not directly utilize amplification operations with the transistor, the distortion factors of the output waveform can be basically eliminated. Particularly, the input signal Vi relates only to the linearity of the first sawtooth-wave Wi and second sawtooth-wave Wout regardless of the input bias voltage characteristic of the transistor. Therefore, the present invention has nothing to do with the characteristics of transistor devices that affect the distortion factors of the output waveform.

Next, a plurality of analog signal amplifiers and devices used therewith will be described in accordance with the present invention.

Figure 7:
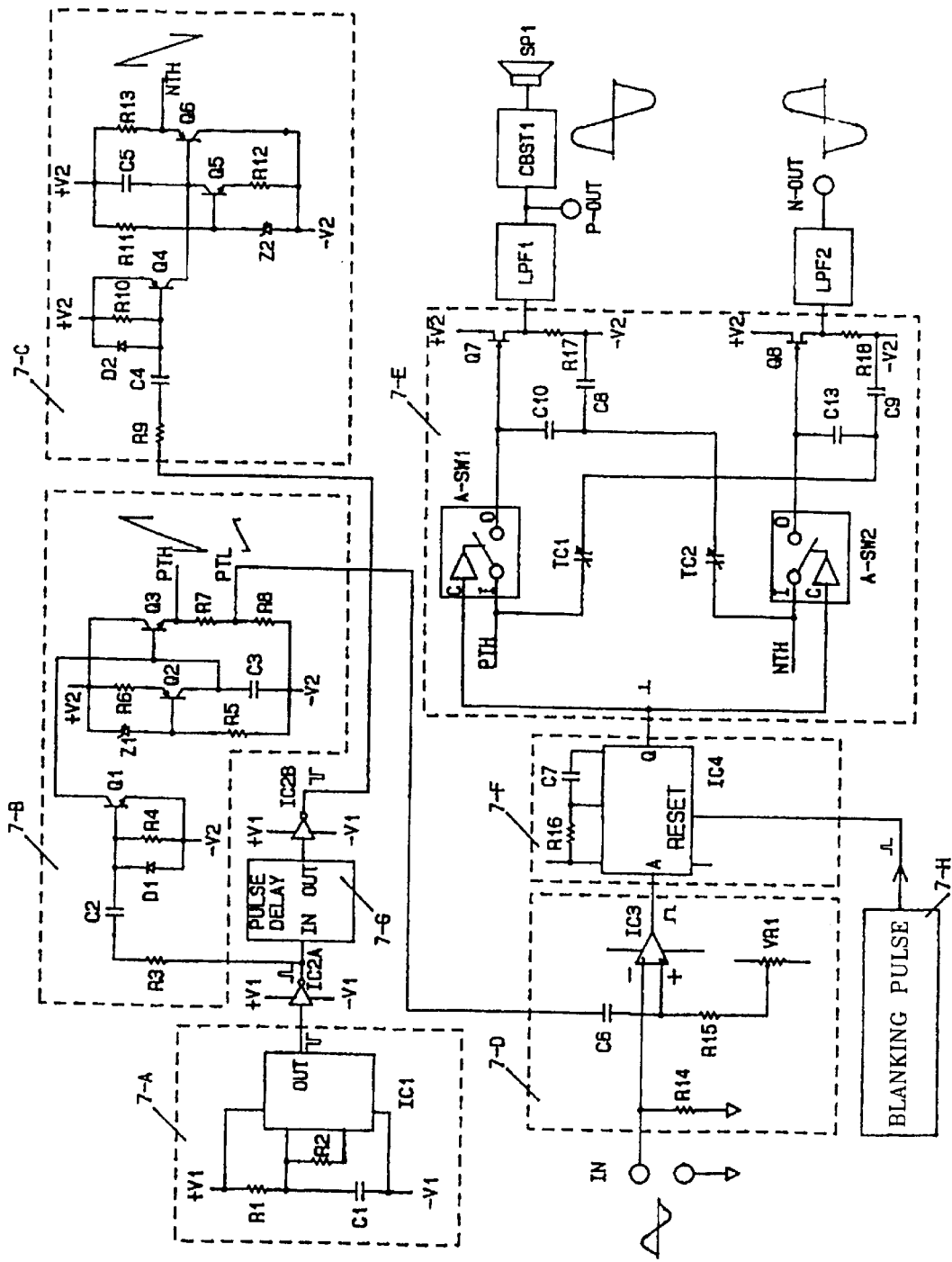
FIG. 7 is an entire circuit view of an analog signal amplifier in accordance with an embodiment of the present invention.

7-A of FIG. 7 illustrates a circuit for generating a clock by the time constant of resistor R1 and condenser C1, and pulses are output to an output terminal OUT. A resistor R2 of the clock generating circuit 7-A is resistance for discharging the charged voltage of the condenser C1. Inverters IC2A and IC2B connected to the output terminal OUT of the clock generating circuit 7-A are used for buffering and inverting the IC1 output of the clock generating circuit 7-A. Positive pulses inverted by the inverter IC2A are used for synchronization to generate the second sawtooth-wave PTH of the second sawtooth-wave generating circuit 7-B, and negative pulses output via the pulse delay circuit 7-G and inverter IC2B are used for synchronization to generate the third sawtooth-wave NTH of the third sawtooth-wave generating circuit 7-C.

In the second sawtooth-wave generating circuit 7-B of FIG. 7, current flows through a pass consisting of resistor R3, condenser C2, base and emitter of transistor Q1 and condenser C2 to charge the condenser C2 if the output of the inverter IC2A turns to high level. At this time, the region between the collector and emitter of the transistor Q1 is turned on to discharge the voltage of the condenser C3. In other words, the operations to reset the sawtooth-waves are performed. Again, if the output terminal of the Inverter IC2A turns to low level, the voltage charged to the condenser C2 of the second sawtooth-wave generating circuit 7-B is discharged via resistor R3, the output terminal of the inverter IC2A, diode D1 of the second sawtooth-wave generating circuit 7-B (generally, the circuit constructed with C2 and D1 is called the CLAMP circuit). And the region between the base and emitter of the transistor Q1 of the second sawtooth-wave generating circuit 7-B turns to the reversed voltage of −0.6 V, so that the region between the collector and emitter of the transistor Q1 turns off. From this time on, the condenser C3 of the second sawtooth-wave generating circuit 7-B starts to be charged at a constant speed by a constant-current supplied from the constant-current circuit of the transistor Q2. Since the voltage between both terminals of the resistor R6 is controlled constantly by transistor Q2 via reference diode Z1 connected to the base of transistor Q2, the current flowing not only through the resistor R6 but also the collector of transistor Q2 is constant-current. The constant-current is supplied to condenser C3 to generate a sawtooth-wave of a good linearity, and the charged voltage of the condenser C3 is instantly discharged by transistor Q1 to generate continuous sawtooth-waves. At this time, the condenser C2 functions to connect the inverter IC2A with transistor Q1 circuit in alternating current, but shuts down the direct current. The change in the voltage of +−V2 with condenser C2 also will result in no influence upon the +−V1 circuit of the clock generating circuit 7-A of normal operations. Thus, it is possible to change the voltage of the +−V2 of the second sawtooth-wave generating circuit 7-B without affecting the +−V1 circuit of the clock generating circuit 7-A, and the +−V2 voltage is in proportion to the peak-to-peak voltage of the sawtooth-wave and, also, to the maximum output voltage of the amplifier. The output of the amplifier can be altered by changing the +−V2 voltage of the second sawtooth-wave generating circuit 7-B without making any changes in the circuit thereof. Transistor Q3 of the second sawtooth-wave generating circuit 7-B buffers the sawtooth-wave voltage generated at the condenser C3 to thereby reduce the output impedance and drive resistors R7, RB, An output of transistor Q3, PTH is used as the second sawtooth-wave of an output level of the amplifier. The sawtooth-wave is voltage-divided by resistors R7, R8 and converted into an input signal level of the first sawtooth-wave PTL having the same period and same phase.

7-C of FIG. 7 illustrates a third sawtooth-wave generating circuit that generates the third sawtooth-wave simultaneously when the second sawtooth-wave is generated. If the output terminal of the Inverter IC2B turns to a low level, current flows via an emitter and base of transistor Q4, condenser C4 and resistor R9 in the third sawtooth-wave generating circuit 7-C and charges the condenser C4. At this time, the region between collector and emitter of transistor Q4 is turned on to discharge the voltage of condenser C5. In other words, operations to reset the sawtooth-wave are performed. If the output terminal of inverter IC2B turns to a high level, the charging voltage of condenser C4 is discharged via diode D2, an output terminal of inverter IC2B and resistor R9 (generally, the circuit constructed with C4 and D2 is called a CLAMP circuit). And the region between the base and emitter of the transistor Q4 turns to the reversed voltage of +0.6 V, so that the region between the collector and emitter of the transistor Q4 is turned off. From this time on, the condenser C5 of the third sawtooth-wave generating circuit 7-C starts to be charged at a constant speed by constant-current supplied from the constant-current circuit of the transistor Q5. Since the voltage between both terminals of the resistor R12 is controlled constant by transistor Q5 via reference diode Z2 connected to the base of transistor Q5, the current flowing not only through the resistor R12 but also the collector of transistor Q5 is constant-current. The constant-current is supplied to condenser C5 to generate a sawtooth-wave of a good linearity, and the charged voltage of the condenser C5 is instantly discharged by transistor Q4 to generate continuous sawtooth-wave. At this time, the condenser C4 functions to connect the inverter IC2B with transistor Q4 circuit in alternating current, but shuts down the direct current. The change in the voltage of +−V2 with condenser C4 also will result in no influence on the +−V1 circuit of the clock generating circuit 7-A in normal operations. Thus, it becomes possible to change the voltage of the +−V2 of the third sawtooth-wave generating circuit 7-C without affecting the +−V1 circuit of the clock generating circuit 7-A, and the +−V2 voltage is in proportion to the peak-to-peak voltage of the sawtooth-wave and, also, to the maximum output voltage of the amplifier. The output of the amplifier can be altered by changing the +−V2 voltage without making any changes in the circuit thereof. Transistor Q6 of the third sawtooth-wave generating circuit 7-C buffers the sawtooth-wave voltage generated at the condenser C5 to thereby reduce the output impedance and drive resistors R13. An output of transistor Q6, NTH is used as the third sawtooth-wave of an output level of the amplifier.

7-D of FIG. 7 functions as a comparator for comparing an analog signal supplied to input terminal IN with the first sawtooth-wave PTL at comparator IC3 and generating the output of high level only within a period of time during which the first sawtooth-wave PTL signal is higher than the input signal. The pulse widths of the high level signals are varied depending upon the magnitudes of the input signals. The high level signals are changed into a narrow pulse by IC4 of the one-shot vibrator 7-F at the pulse starting point.

In other words, the one-shot vibrator 7-F shown in FIG. 7 functions to form the second pulses having narrow widths by inputting and changing the first pulses output from the comparator IC3. At this time, the pulses are determined by resistor R16 and condenser C7. In the one-shot vibrator 7-F, the narrow pulse of IC4 is outputted as a positive pulse at terminal Q and supplied to a control terminal C of analog switches A-SW1, A-SW2 of an analog switch circuit 7-E. At the rising points of the first pulses, the second pulses are generated with the pulse width thereof related to a time constant of resistor R16 and condenser C7 of the one-shot vibrator 7-F. A certain period of time elapses from the rising point of the first pulse to that of the second pulse, which is called a delay time Tplh between input and output of the one-shot vibrator, generally, about 300 nS in CMOS. As shown in B of FIG. 14, the first pulses are generated when analog signal input signals are close to maximum value at the comparator. The first pulses are input to IC4 of the one-shot vibrator 7-F. At this time, the second pulses generate as shown in C of FIG. 14 if there is no input/output delay time OnS at IC4. At this time, the analog output waveforms have the maximum level of voltage as shown in E of FIG. 14. However, since there is a delay time Tplh of IC 4, the second pulses generate after the delay time Tplh passes as shown in D of FIG. 14. At this time, if the second sawtooth-wave (F of FIG. 14) passes its highest point and gets close to its lowest point, a minimum level of voltage is extracted by the second pulse (D of FIG. 14) and the analog output is suddenly changed to the minimum level of voltage (F of FIG.14). When the output drives speaker by a power amplification device, it may damage the speaker. Therefore, in any case, there should be no continuous and sudden changes in the waveform of the output.

Figure 14:
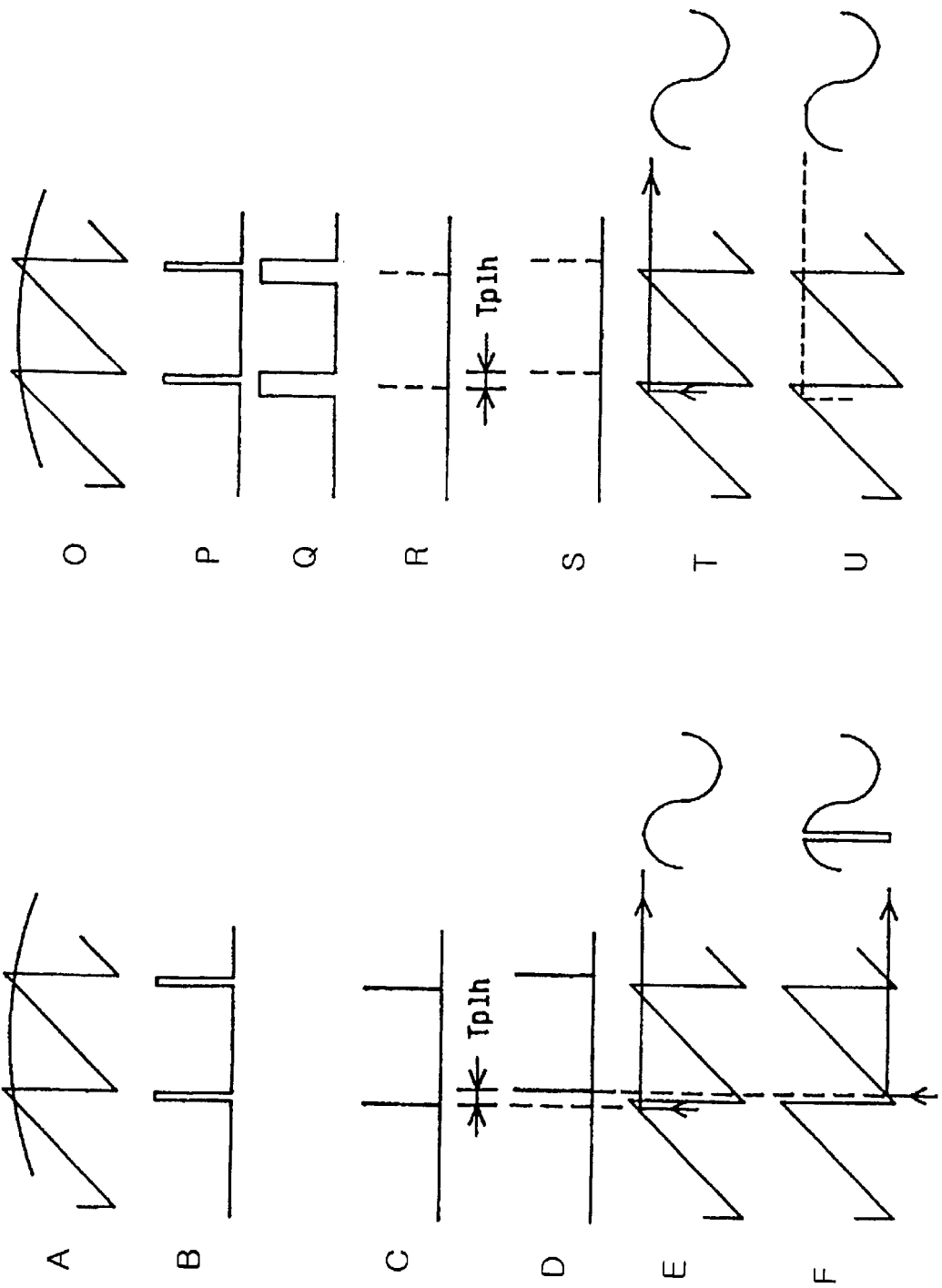
FIG. 14 is a curve view for comparing and explaining a plurality of waveforms related to analog output waveforms in accordance with the present invention.

The method for preventing the above phenomenon will be described. A blanking pulse of high level (7-H in FIG. 7, Q in FIG. 14) is applied to a reset terminal (7-F in FIG. 7) of IC4 of one-shot vibrator. The applied blanking pulse has a rising edge advanced by the delayed time Tplh from a changing point from the highest point to the lowest point in the second sawtooth-wave (O in FIG. 14). Even if the first pulse is inputted to input A of the IC4 while the blanking pulse is applied to the reset terminal RESET, the second pulse is not outputted. If the first pulse, as shown in FIG. 14-P, close to the maximum value of the input signal is inputted to the input A of the IC4 of the one-shot vibrator, the second pulse is not outputted because the first pulse belongs to a period of the blanking pulse (S in FIG. 14). At this time, it is possible to keep the first pulse at the previously extracted voltage and prevent rapid inversion of the output voltage.

Figure 15:
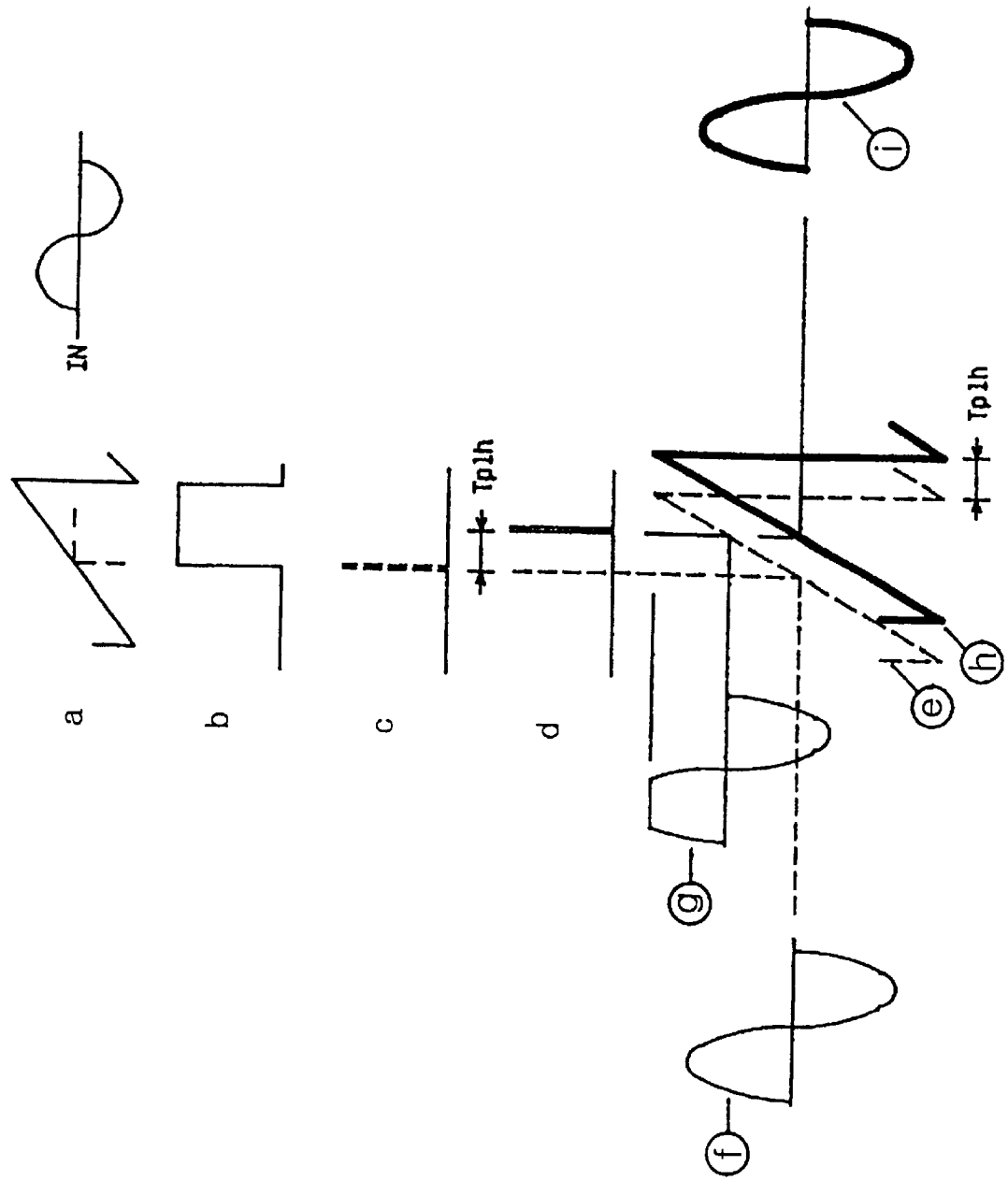
FIG. 15 is a curve view for explaining the relationship between analog input/output waveforms in accordance with the present invention.

As shown in FIG. 15, a description will be made about the second and third sawtooth-waves that will be delayed to correct the operational range of the output.

The comparator circuit 7-D of FIG. 7 functions as a comparator for comparing an analog signal supplied to input terminal IN with the first sawtooth-wave PTL at comparator IC3 and generating the output of high level only within a period of time during which the first sawtooth-wave PTL signal is higher than the input signal IN. The pulse widths of high level signals are varied depending upon the magnitudes of the input signal. The high level signals are changed into a narrow pulse by IC4 of the one-shot vibrator 7-F at the pulse starting point.

The one-shot vibrator 7-F shown in FIGS. 7 and 15 functions to form second narrow pulses by inputting and changing the first pulses (b in FIG. 15) output from the comparator IC3 of the comparator circuit 7-D with an input signal level of the first sawtooth-wave and the input signal IN. Even if it is preferable that the second pulse generates at the rising edge point of the first pulse ⓒ in FIG. 14), a certain period of time elapses from the rising point of the first pulse to that of the second pulse (d in FIG. 14), which is called a delay time Tplh between the input and output of the one-shot vibrator, generally, about 300 nS in CMOS. The delay time Tplh brings about deviation when the voltage of the second or third sawtooth-wave is extracted from the analog switch (7-E in FIG. 7) and the top portion of the resultant output waveform is distorted to make the scope of the maximum output smaller. The aforementioned phenomenon cannot be ignored when the sawtooth-wave frequency is relatively higher. Even if an effort is made to eliminate the phenomenon, there is a limitation in reducing the delay time of the one-shot vibrator.

However, an output level of the sawtooth-wave (the second or third sawtooth-wave) is delayed and generated by delaying the reset pulse of the sawtooth-wave generator in the pulse delay circuit 7-G of FIG. 7 and then applying it to the reset circuit of the sawtooth-wave generator; the maximum output voltage (I in FIG. 15) which is not distorted can be extracted from the resultant output second pulse (d in FIG. 15). (The third sawtooth-wave circuit in FIG. 7 and the second sawtooth-wave in FIG. 15 are the same)

Next, a description will be made about a sample/hold circuit 7-E composed of analog switch (or high-speed switch) in FIG. 7. An output level of the second sawtooth-wave PTH is supplied from the second sawtooth-wave generating circuit 7-B to terminal I of the analog switch A-SW1 of the sample/hold circuit 7-E, and condensers C10, C8 are charged by it during a pulse period of the control terminal C (C8 has a much greater capacity than C10). Then, the second sawtooth-wave PTH is buffered by transistor Q7 and filtered by LPF1 (positioned at the right top portion outside the sample/hold circuit 7-E in FIG. 7) to thereby output to terminal P-OUT the amplified analog signal having the same phase as that of the input signal. Also, the third sawtooth-wave NTH of output level is supplied from the third sawtooth-wave generating circuit 7-C to terminal I of the analog switch A-SW2 and condensers C13, C9 are charged by it during a pulse period of the control terminal (C9 has a much greater capacity than C13). Then, the third sawtooth-wave NTH is buffered by transistor Q8 and filtered by LPF2 (positioned at the right bottom portion outside the sample/hold circuit 7-E in FIG. 7) to thereby output to terminal N-OUT the amplified analog signal having the reversed phase with respect to that of the input signal. Even if the voltage charged to condenser C10 should be kept at its constant level until the following time of charge returns charged again, the circuit impedance of condenser C10 is so great that it shows a ripple shaped identically to the second sawtooth-wave PTH of the second sawtooth-wave generating circuit 7-B by a capacitance between input I and output O of the analog switch A-SW1 or a capacitance between patterns of PCB. The ripple would not be completely eliminated by being filtered through the low pass filter LPF1, only to generate noise. Thus, the third sawtooth-wave NTH having reversed phase of the second sawtooth-wave PTH is voltage-divided by TC2 and condenser C8 of the analog switch circuit 7-E to smaller voltages to be overlapped to condenser C10. Then, the trimmer condenser TC2 is adjusted to make the divided voltage in reversed phase cross the condenser C8 identical to the ripple voltage, thereby offsetting the ripple.

Further, even if the voltage charged to condenser C13 should be kept at its constant level until the following time of charge returns again, the circuit impedance of condenser C13 is so great that it shows a ripple shaped identically to the third sawtooth-wave NTH by capacitance between input I and output O of the analog switch A-SW2 or capacitance between patterns of PCB. The ripple is not completely eliminated by being filtered through the low pass filter LPF2, only to generate noise. Thus the second sawtooth-wave PTH having reversed phase of the third sawtooth-wave NTH is voltage-divided by TC1 and condenser C9 of the analog switch circuit 7-E to smaller voltages to be overlapped to condenser C13. Then, the trimmer condenser TC1 is adjusted to make the divided voltage in reversed phase between both terminals of the condenser C9 identical to the ripple voltage, thereby offsetting the ripple. The output signal (P-OUT) of the LPF1 amplified to the same phase as the input signal (IN) of the comparator circuit (7-D) is input to the power-amplification device (CBST1: current booster) connected with LPF1 for power-amplification to drive the speaker (SP1) that is connected with the speaker (SP1).

Figure 8:
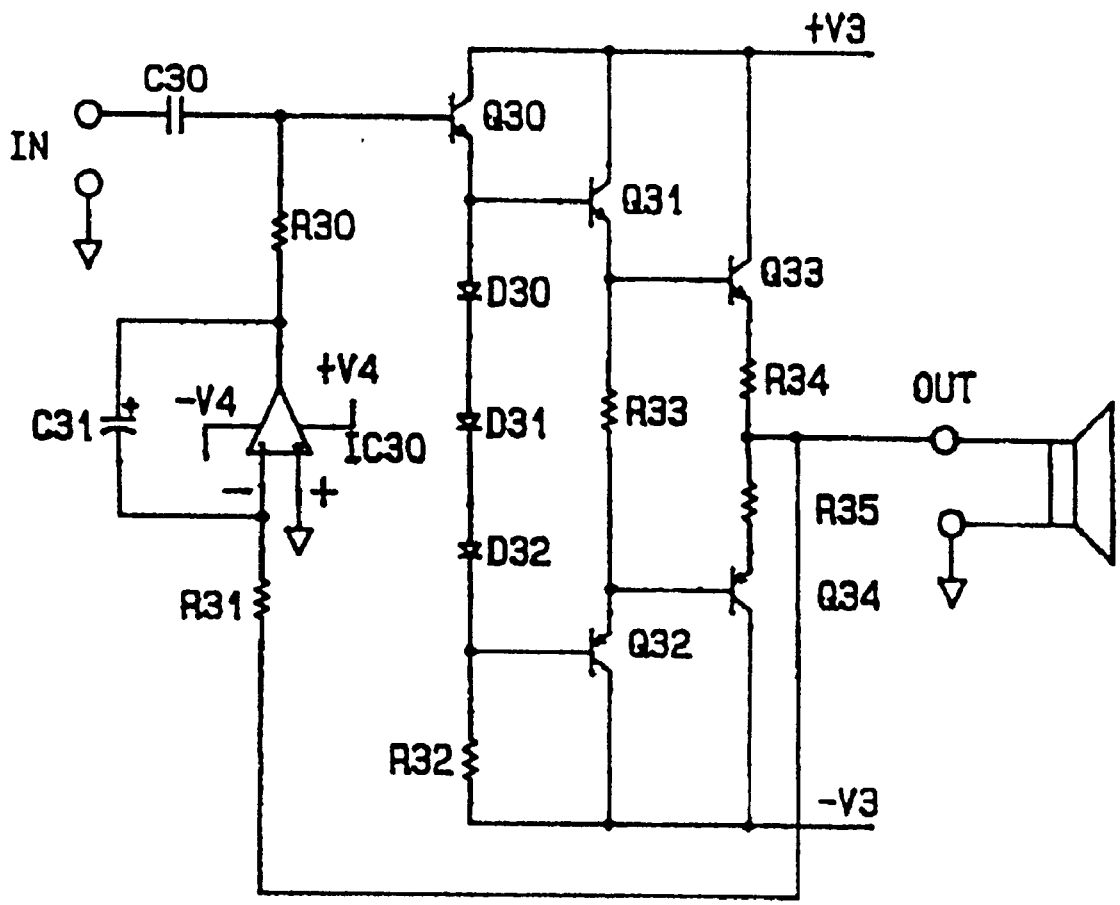
FIG. 8 illustrates a circuit view of a power amplification device used for an amplifier in accordance with an embodiment of the present invention.

FIG. 8 is a circuit view for illustrating a power-amplification device CBST1, and its output terminal OUT should maintain the electric potential of 0 V having a DC characteristic at all times by controlling an operational amplifier IC30 so that the speaker may be connected between an output terminal OUT and a common ground terminal. The non-inverting terminal (+) of the operational amplifier IC30 is connected to a common ground terminal and its inverting terminal (−) is connected with an output terminal OUT of the power-amplification device (CBST1: current booster) via R31. The output of the operational amplifier IC30 is connected with a base of transistor Q30 via R30 to control the bias voltage of transistor Q30. The time constant of R31×C31 should be larger by connecting condenser C31 between the inverting terminal (−) and the output of the operational amplifier IC30 to thereby control only the status of DC and not the signal voltage.

Next, a description will be made about the operations of the power-amplification device CBST1. If the output terminal OUT increases in the+direction, the inverting terminal (−) of the operational amplifier IC30 increases in the+ direction but output gets lower to the (−) direction. These changes reduce the base voltage of transistor Q30, and then, the emitter voltage of transistor Q30 decreases, thereby letting the output terminal OUT return to its electric potential of 0. Also, the output terminal OUT decreases in the (−) direction, the inverting terminal (−) of the operational amplifier IC30 decreases in the (−) direction but the output increases in the (+) direction. These changes raise the base voltage of transistor Q30, and then, the emitter voltage of transistors Q31, Q33 increases, thereby letting the output terminal OUT return to its electric potential of 0.

Figure 9:
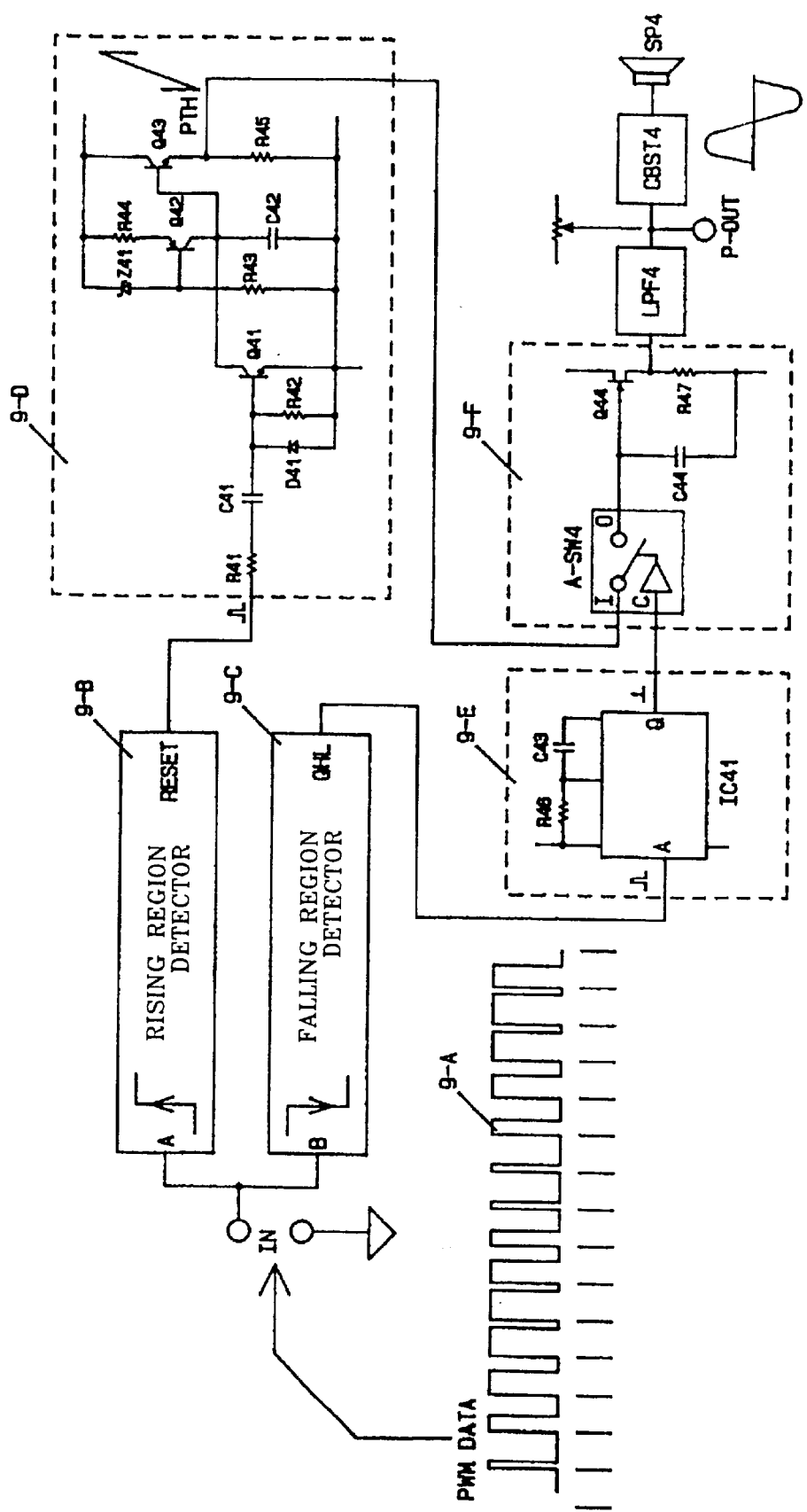
FIG. 9 illustrates a circuit view of an amplifier used to input a PWM signal in accordance with the present invention.
Figure 10:
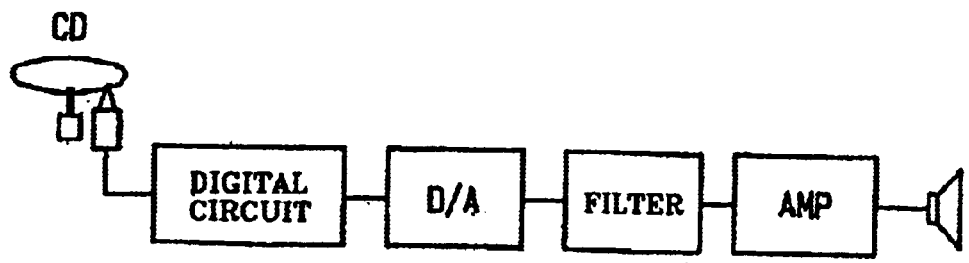
FIG. 10 is a block view for illustrating the typical structure of a conventional digital device (for instance; a CD player)

FIG. 9 is a conceptual view for illustrating an example of an amplifying method when an input of an amplifier is input with a PWM signal. Nowadays, there are a number of digital devices such as a CDP to replay digitally recorded sounds. There are many devices adapting digital methods for processing signals in order to output audible sounds. FIG. 10 illustrates an example of a CD player, a digitally signal-processing device of the prior art. In the device, the digitally processed signals are finally outputted as audible sounds through the following processes: D/A conversion, filtration and amplification. Undesirable deformation in signals may occur during the processes of D/A conversion and amplification, and a number of parts are required to construct the circuit.

Figure 11:
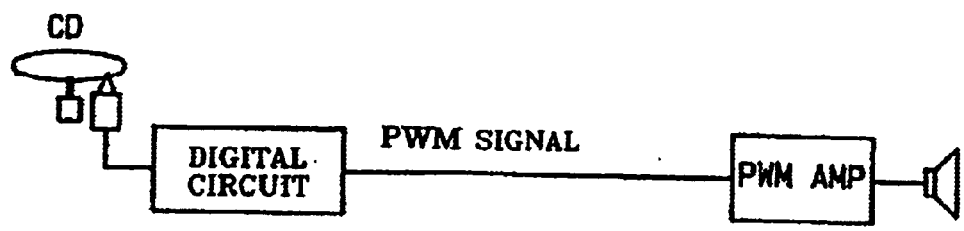
FIG. 11 is a block view for illustrating the structure of a PWM signal amplifier in accordance with the present invention.
Figure 12:
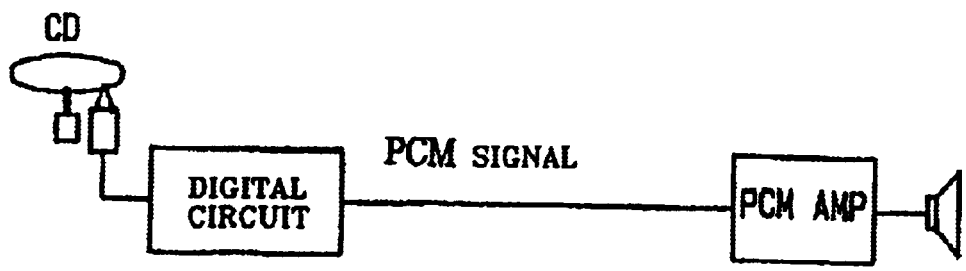
FIG. 12 is a structural view for illustrating a digital data (PCM signal) amplifier in accordance with the present invention.

FIG. 11 is a structural view for illustrating a PWM signal amplifier. If the PWM signal amplifier is an apparatus that processes with PWM signals in a digital device, the PWM signals are directly connected to the PWM input amplifier shown in FIG. 9, so that the amplifier is constructed in a simple manner without the digital/analog conversion circuit required. Besides, since there is no deforming factor in the amplification device, it is possible to produce the signals without distortion in the amplification process.

Hereinafter, operations of the PWM input amplifier will be described with reference to FIG. 9 in accordance with the present invention.

A PWM signal 9-A is supplied to an input terminal IN. The PWM signal 9-A always has a constant period for rising to its high level from its low level. The rising points to the high level from the low level are references of the PWM signal. The PWM signal 9-A has its width of a high pulse period in proportion to magnitude of the signals to be processed. Furthermore, at every period, it has different points where the signal gets down from its high level to its low level. If the PWM signal 9-A is inputted to an input terminal IN, a rising point detector 9-B detects a point where the signal turns from its low level to its high level to thereby output a high pulse via a resetting terminal RESET. The high pulse passes through resistor R41 and condenser C41 of the second sawtooth-wave generating and sawtooth-wave reset circuit 9-D and lets current flow to the base and emitter of transistor Q41 to thereby turn on the collector and emitter of transistor Q41 and momentarily discharge condenser C42 at an output level of the sawtooth-wave generating circuit. Accordingly, when the output pulse of the reset terminal RESET gets down to its low level, transistor Q41 is turned off to start charging condenser Q42.

The constant voltage of the diode Z41 enables a current to flow through resistor R44 connected with the emitter of transistor Q42 at all times. The current is charged at a constant speed to condenser C42 to thereby generate a sawtooth-wave of good linearity. The sawtooth-wave is buffered by transistor Q43, and then supplied to an input terminal I of the analog switch A-SW4. On the other hand, a falling point detector 9-C detects a point where the signal turns to its low level from its high level of the PWM signal 9-A input to an input terminal IN, to thereby output a high pulse of an output QHL. The QHL pulse is generated in proportion to a high pulse region of the PWM signal 9-A. In other words, if the high level of the PWM signal 9-A is narrower in width, the QHL pulse is generated at a place close to the point of starting the second sawtooth-wave PTH output from the reset terminal RESET. On the contrary, if the high level of the PWM signal 9-A is larger in width, the QHL pulse is generated at a place far from the point of starting the second sawtooth-wave PTH output from the reset terminal RESET. The QHL pulse is inputted to the one-shot vibrator IC41 of the one-shot vibrator 9-E and formed into a narrow pulse, which is then inputted to the control terminal C of the analog switch A-SW4 of the buffer circuit 9-F. While the narrow pulse (Q of IC41) is supplied, the analog switch A-SW4 is turned on to charge the voltage of the second sawtooth-wave PTH to condenser C44. The magnitude of voltage to be charged to condenser C44 is in proportion to the width of the high level of the PWM signal 9-A. It is also an analog signal produced by detecting, maintaining and amplifying the second sawtooth-wave PTH of output at a point of generating a narrow pulse (Q of IC41) of the one-shot vibrator 9-E. At this time, the signal is a continuous smoothing analog signal without deformations. The analog signal is buffered by transistor Q44 of the buffer circuit 9-F and filtered by low pass filter LPF4 connected with the buffer circuit 9-F. A speaker SP4 is driven by a power-amplification device CBST4 (current booster) connected with the low pass filter LPF4. The aforementioned operations are repeated at every period of the PWM signal.

Figure 13:
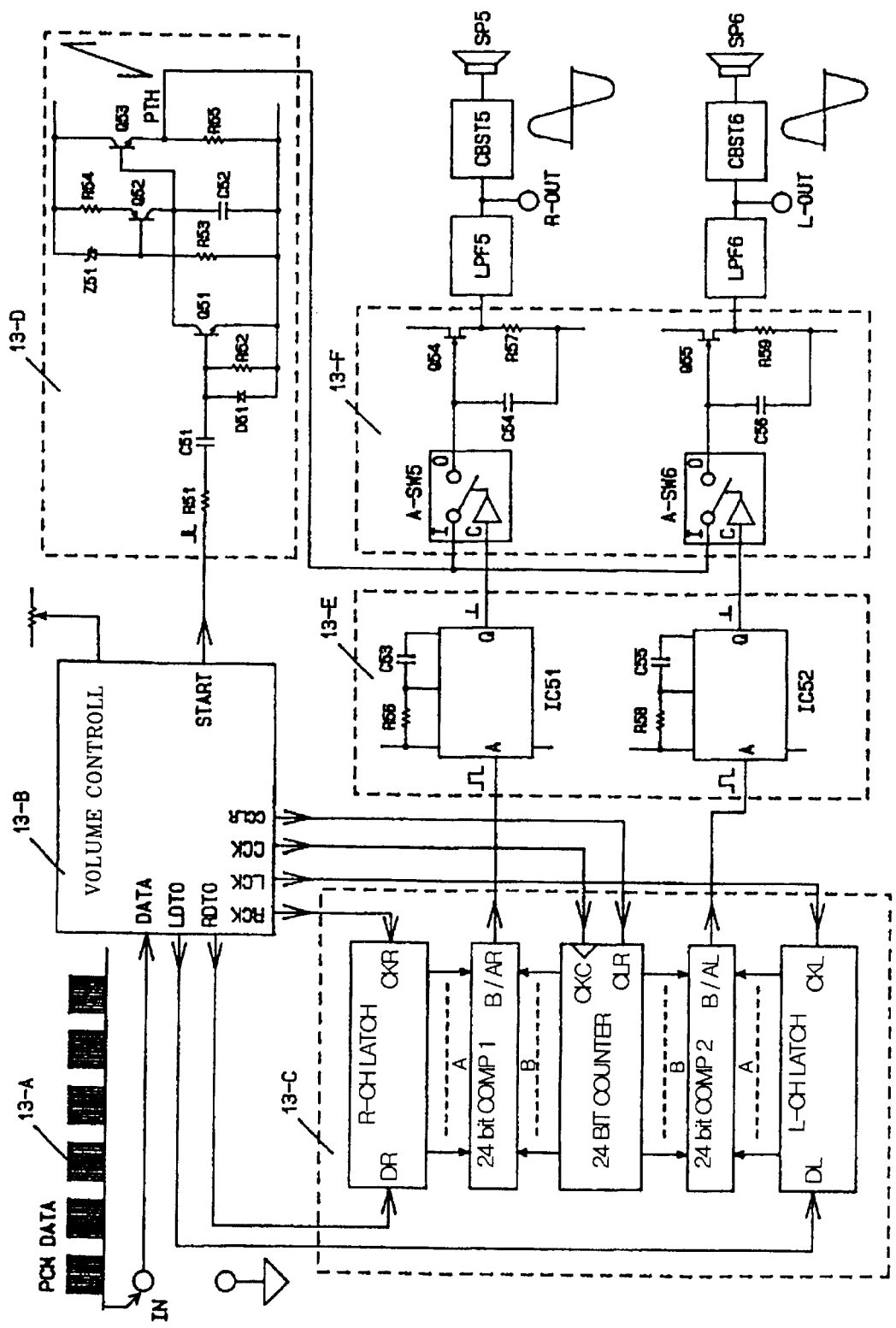
FIG. 13 is a circuit view for illustrating a digital data (PCM signal) inputting amplifier in accordance with the present invention.

FIG. 13 is a conceptual view for illustrating an amplification method when an input signal of the amplifier is inputted as a pulse code modulation (PCM) signal in accordance with an embodiment of the present invention. As described above, there have recently been a number of devices adapting a digital method for processing audio signals. FIG. 10 illustrates a representative example of a CD player that processes signals in a digital method in accordance with the prior art. The signal processed in the digital device is outputted after the processes of D/A signal conversion, filtration and amplification. Undesirable deformation in signals may occur during the processes of D/A conversion and amplification, and a number of parts are required to construct of the circuit. If the signal amplifier is an apparatus that processes with PCM signals in a digital device, the PCM signals are connected to the PCM input amplifier shown in FIG. 13, so that the amplifier is constructed in a simple manner without the digital/analog conversion circuit. Besides, since there is no deforming factor in the amplification device, it is possible to produce the signals without distortion in the amplification process.

Hereinafter, the operations of the PCM input amplifier shown in FIG. 13 will be described in accordance with the present invention.

In FIG. 13, a PCM signal 13-A is inputted to an input terminal IN. The PCM signals 13-A are signals to regularly send digital values (for instance, 24 bit value) in a series obtained by sampling analog signals at a predetermined period (for instance, 44.1 KHZ). The signals include a right signal, left signal, control signal or other data. Even if PCM signals 13-A are taken as an example, it is also possible to receive and process all sorts of information obtained by optical output, DSD (super audio) format, IrDA telecommunication, IEEE1394 telecommunication, which are generally called digital information. The PCM signal 13-A input to the input terminal IN is classified and processed in a digital data (at this time, "PCM signal") processing controller 13-B. After the right signal data analyzed in the digital data (PCM signal) processing controller is outputted to a RDTO terminal, a high pulse is outputted to a RCK terminal to latch a value to the right latch (R-CH LATCH) of a storage/comparison unit 13-C. At this time, the storage/comparison unit 13-C includes a right latch (R-CH LATCH), left latch (L-CH LATCH), comparator 1 (24 bit COM1), comparator 2 (24 bit COM2) and a counter (24 bit COUNTER). On the other hand, after the left signal data analyzed in the digital data processing controller 13-B is outputted via the LDTO terminal, the high pulse is outputted via the LCK terminal to latch its value to the left latch (L-CH LATCH) of the storage/comparison unit 13-C. The latched values are digital values corresponding to magnitudes of the right and left analogs. The high pulse is outputted via a CCLR terminal from the digital data (PCM signal) processing controller 13-B to reset a 24 bit counter (24 bit COUNTER). At this time, the output terminals B>AL and B>AR of the 24 bit comparators 1 (24 bit COM1) and 2 (24 bit COM2) are all outputted at the low level. As the 24 bit counter (24 bit COUNTER) of the B terminal of the 24 bit comparator is cleared to 0, and the latch of the A terminal is set with PCM data, B is not larger than A. Therefore, the output terminals B>AL and B>AR turn to "not-true" to output a low level. At the same time, if a high pulse is outputted to a start terminal START when the digital data (PCM signal) generates a data starting control signal, a current starts to flow through resistor R51, condenser C51, base and emitter of transistor Q51 in the second sawtooth-wave generating and sawtooth-wave reset circuit (13-D) to turn on the path between the collector and emitter of transistor Q51. If the start terminal START turns to its low level after condenser C52 is discharged, condenser C52 starts to be charged. At this time, clocks are outputted via CCK of the digital data (PCM signal) processing controller 13-B, and then, the 24 bit counter of the storage/comparison unit 13-C starts up-count operations. After the 24 bit counter starts its up-count operations, and if the value of the counter becomes greater than that of respective latches, the B>AL and B>AR terminals of the relevant comparators will output a high level. In other words, if the value of the 24 bit counter becomes greater than that of the right latch (R-CH LATCH), the B>AR terminal is outputted at a high level and formed into a narrow pulse by the one-shot vibrator 13-E. The formed signal is inputted to the control terminal C of the analog switch A-SW5 in the analog switch and buffer circuit 13-F. While the narrow pulse is supplied to the analog switch A-SW5 from Q terminal of the one-shot vibrator IC51, the analog switch A-SW5 is turned to charge condenser C54 with the voltage of the second sawtooth-wave PTH. The magnitude of voltage charged to the condenser C54 is in proportion to a value of the right signal of the PCM signal. It is also an analog signal produced by detecting, maintaining and amplifying the second sawtooth-wave PTH of output level at the point of generating a narrow pulse (a signal generated at the Q of IC51). At this time, the signal is a continuous smoothing analog signal without deformations. The analog signal is buffered by transistor Q54 and filtered by low pass filter LPF5 connected with the analog switch and buffer circuit 13-F. As a result, speaker SP5 is driven by a power-amplification device CBST5 (current booster) connected with the low pass filter LPF5. On the other hand, if the value of the 24 bit counter is greater than that of the left latch (L-CH LATCH) in the storage/ comparison unit 13-C, the B>AL terminal is outputted as its high level. Then, it is inputted to terminal A of the one-shot vibrator IC52 to be formed into a narrow pulse. The formed pulse is inputted to the control terminal C of analog switch A-SW6 in the analog switch and buffer circuit 13-F. While the narrow pulse is supplied to the analog switch A-SW6 from Q of the one-shot vibrator IC52, the analog switch A-SW6 is turned on to charge condenser C56 with the voltage of the second sawtooth-wave PTH. The magnitude of voltage to be charged to condenser C56 is proportional to the left signal value of the PCM signal. It is also an analog signal produced by detecting, maintaining and amplifying the second sawtooth-wave PTH of output level at the point of generating a narrow pulse (a signal generated at the Q of IC52) of the one-shot vibrator 13-E. At this time, the signal is a continuous smoothing analog signal without any deformations. The analog signal is buffered by transistor Q55 and filtered by low pass filter LPF6. As a result; speaker SP6 is driven by a power-amplification device CBST6 (current booster). The aforementioned operations are repeated at every period of the PCM signal.

Figure 3A:
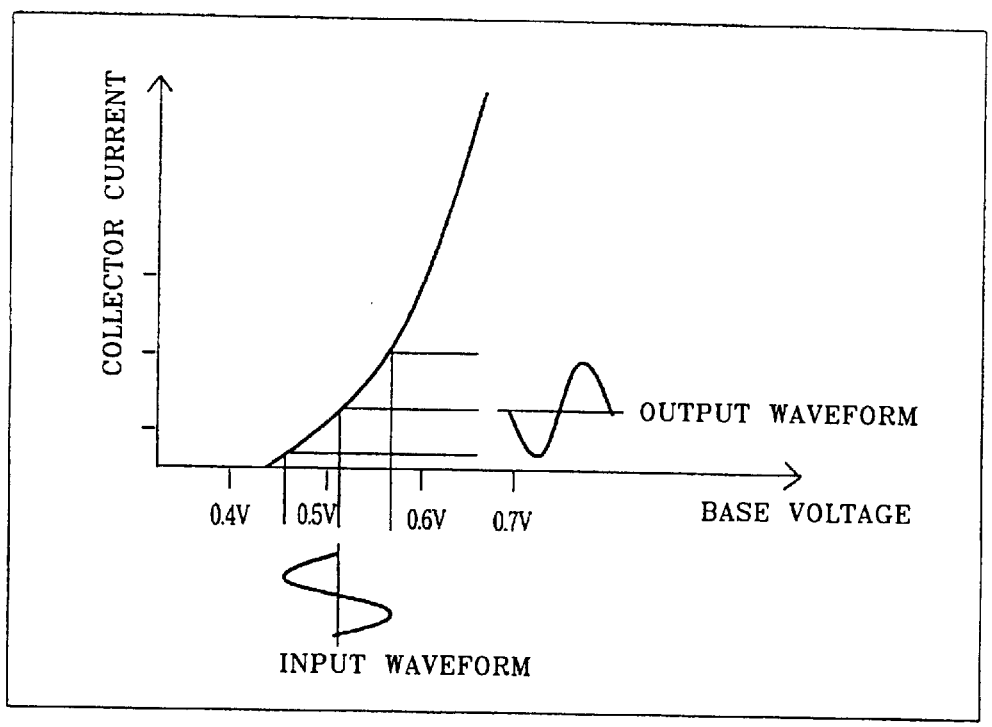
FIG. 3a illustrates an input/output conversion characteristic of a transistor having small input signal in accordance with the prior art.
Figure 3B:
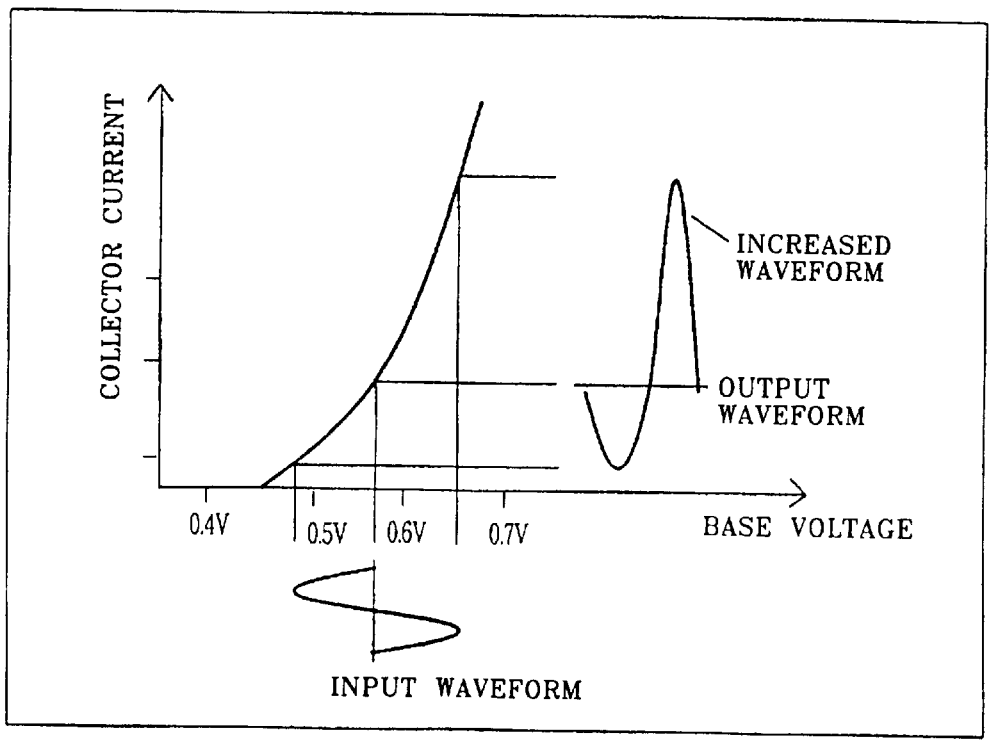
FIG. 3b illustrates an input/output conversion characteristic of a transistor having large input signal in accordance with the prior art.

As described above, the following advantages in the present invention exist. At first, in contrast to the prior art shown in FIG. 3a having: the non-linear characteristic in base voltage and collector voltage; distortions due to a narrow range of voltage; characteristic having a narrow linearity range, the present invention can easily and favorably generate linearity of the first sawtooth-wave and have no limitation on the voltage range. Therefore, the total amplitude (total range of voltage) of the rising region of the sawtooth-wave is used for the linearity range, so that there will be no distortion of cross-modulation to the signal within the range of linearity used for sawtooth-wave.

Figure 4A:
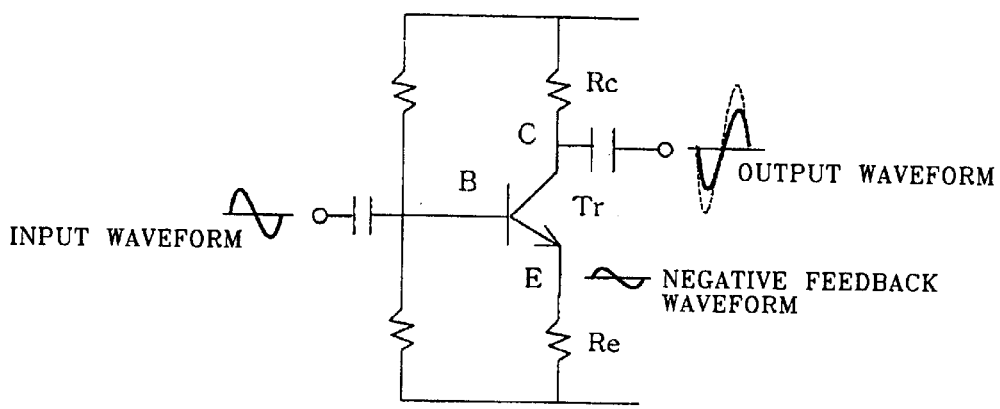
FIG. 4a is a conceptual view for illustrating a negative feedback operation in an amplifier circuit having one transistor for amplification in accordance with the prior art.
Figure 4B:
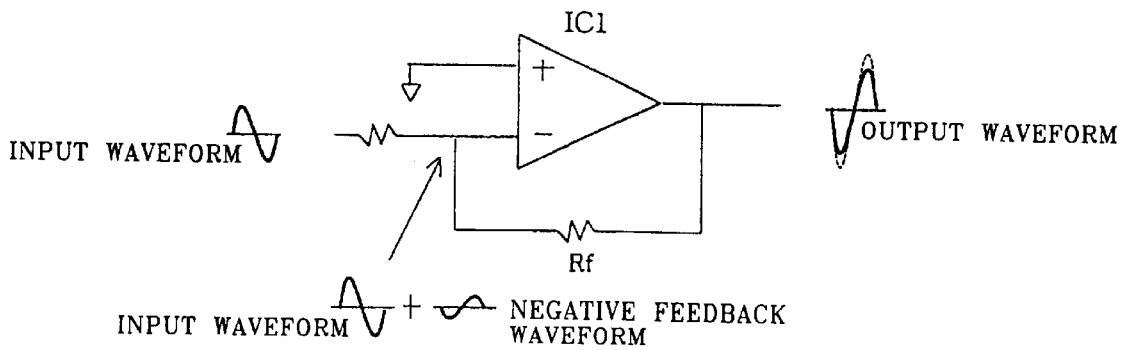
FIG. 4b is a conceptual view for illustrating a negative feedback operation in an integrated circuit device consisting of transistors in accordance with the prior art.
Figure 4C:
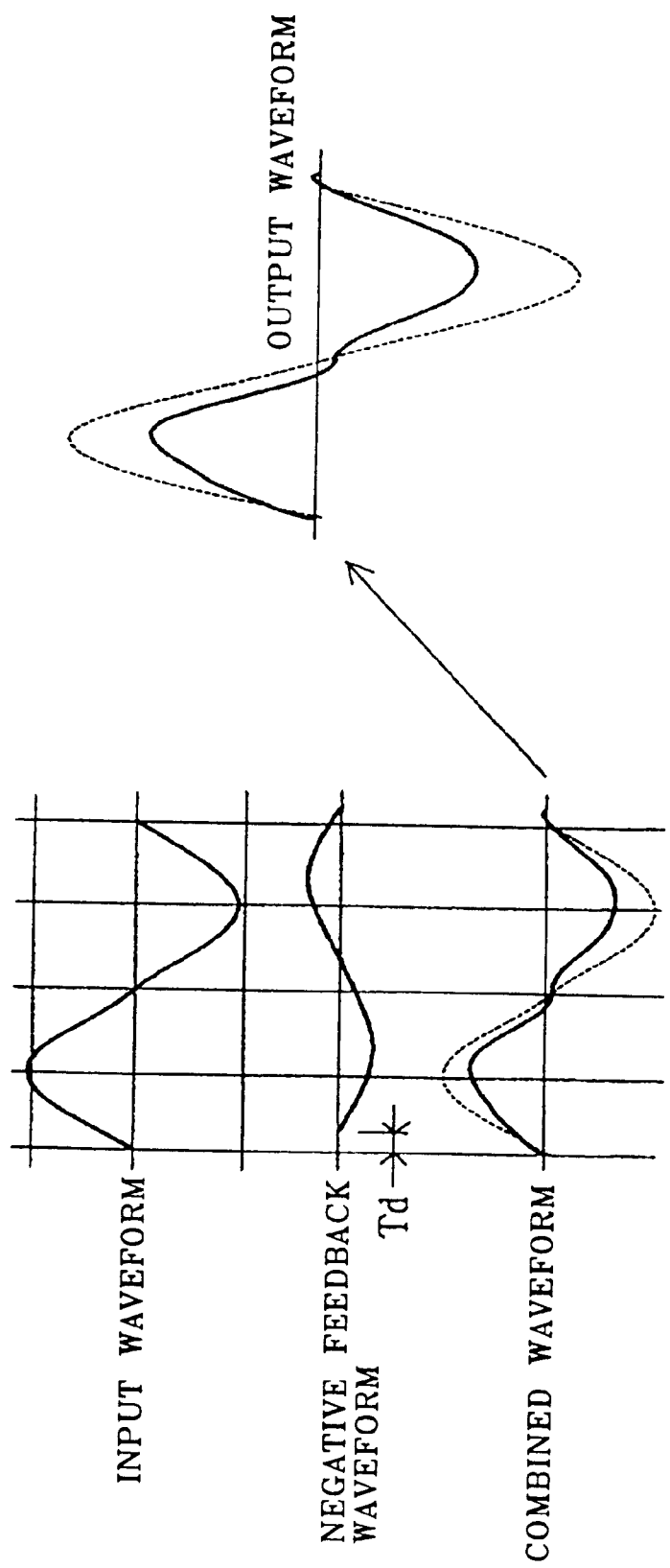
FIG. 4c is a conceptual view for illustrating distortion of an output waveform according to a negative feedback signal delay in accordance with the prior art.

Secondly, in contrast to an IC amplification of the prior art shown in FIG. 4b, where there has been distortion in output waveform of the negative feedback circuit due to time delay (Td) or the like since the output waveform is negatively feedback by Rf to an inverting input (−) to determine amplification degree, the present invention can basically solve the aforementioned problem of a distortion caused by time delay because the negative feedback circuit is not in use.

Figure 5:
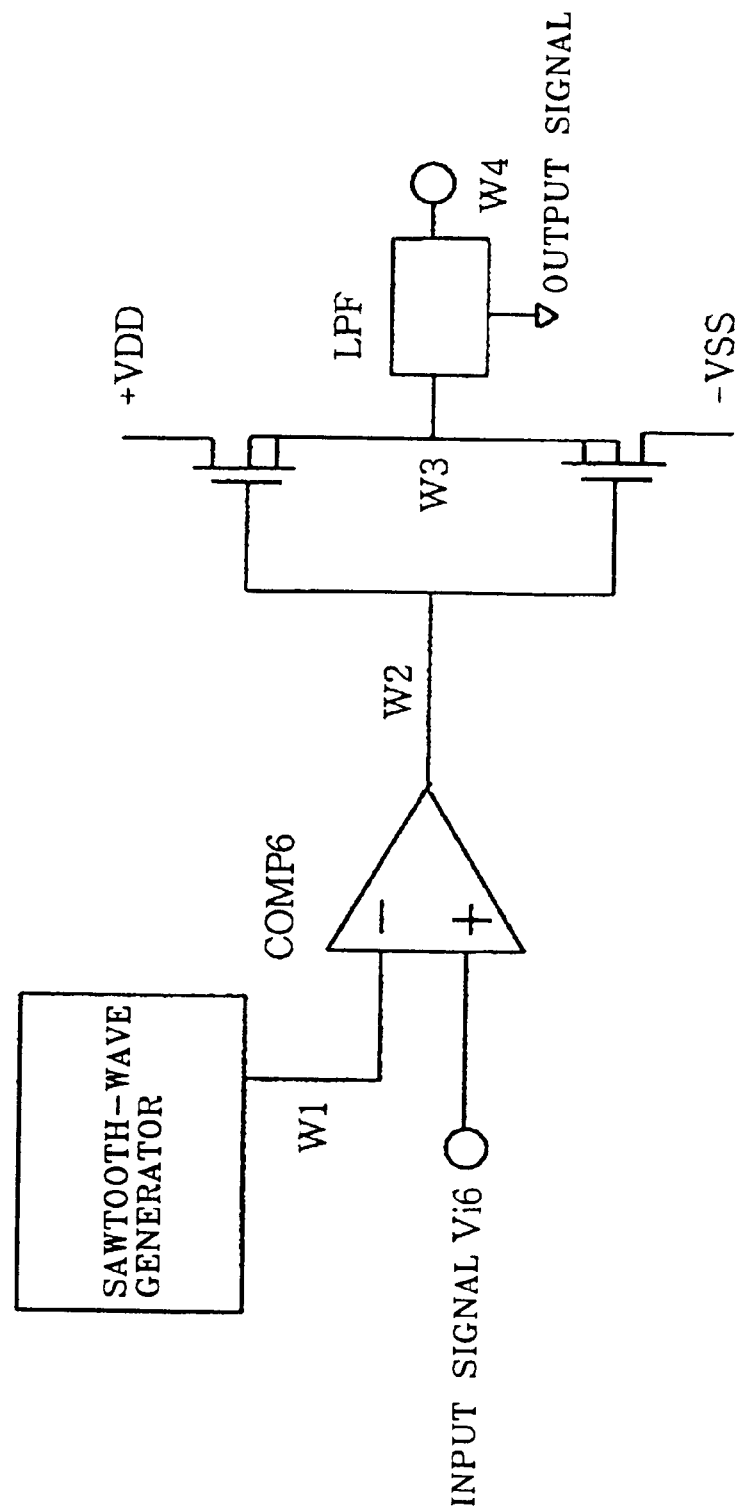
FIG. 5 illustrates instrumentation of a class-D amplifier in accordance with the prior art.
Figure 6:
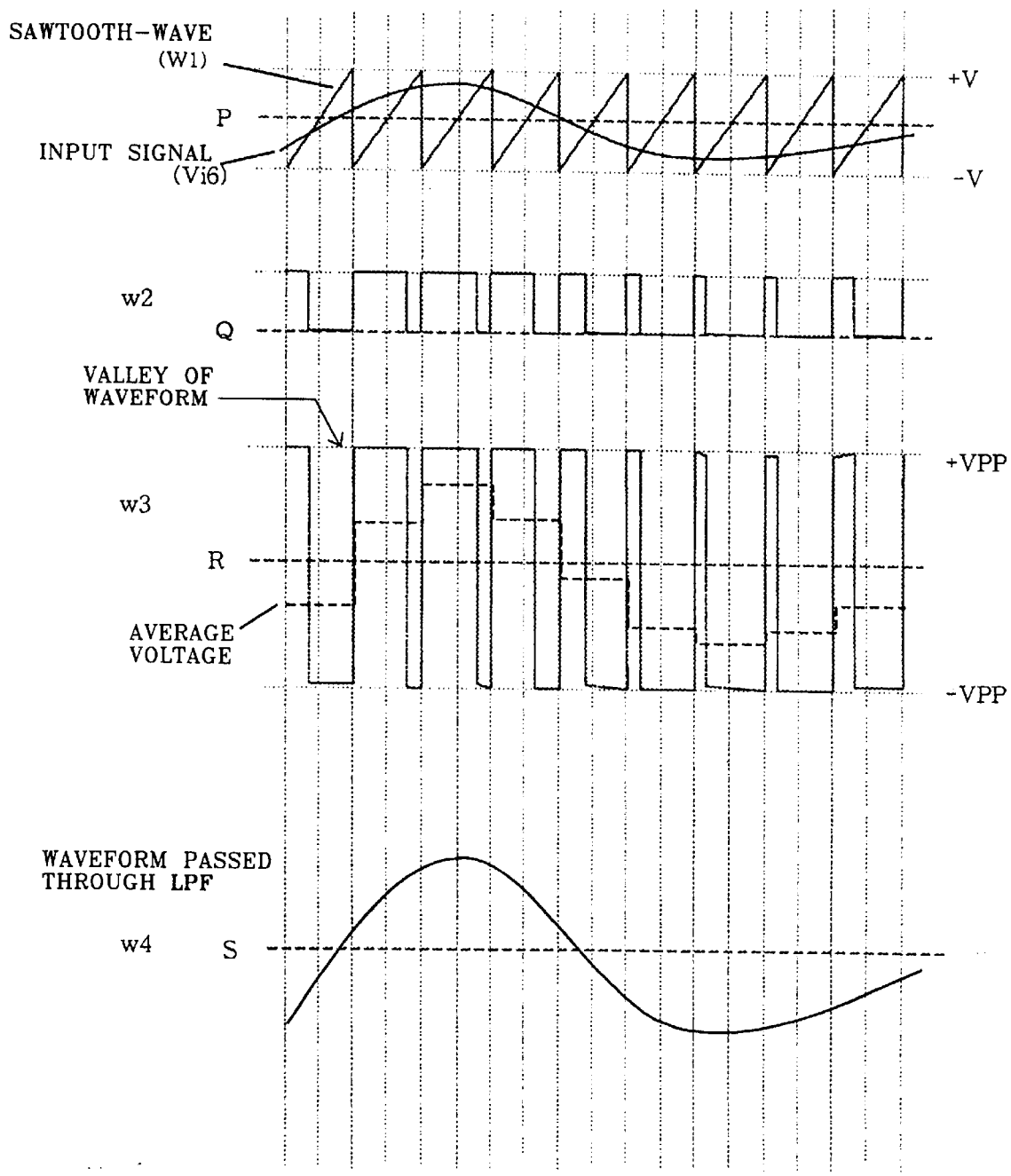
FIG. 6 illustrates operational waveforms of a class-D amplifier in accordance with the prior art.

Thirdly, in an amplification circuit having a class D amplifier of the prior art shown in FIG. 5, a square wave PWM modulated by input signal Vi6 and sawtooth-wave W1 is in use to thereby require advanced skill and facility to filter a deep valley of the waveform Ⓡ in FIG. 6). There has been noise generating at a power-amplification terminal because it is required to perform filtration at a low pass filter.

Furthermore, large deformities exist in the processes for making an analog input signal into a square wave of a PWM signal and then converting it into an analog signal again, so that it is practically impossible to perfectly reproduce to an original waveform;

However, in the present invention, voltage is extracted from the second sawtooth-wave with the second pulse to be charged to a condenser. This makes it possible to reproduce a continuous smoothing waveform in the conversion process. Therefore, there will be almost no distortion in conversion because of easy filtration with the lower rate of high frequency components and no deforming in its waveform.

Fourthly, it is a real fact that it is difficult to completely regenerate a fully-complemented orchestra performance with the most advanced, modernized amplifier. However, according to the present invention, the input signal is amplified to its original sounds due to the effects of the aforementioned factors, thereby making it possible to completely regenerate a fully-complemented orchestra performance.

Fifthly, in order to change the range of the maximum output of the amplifier, it has been necessary to re-design all of the arrangements from the first amplification stage to the output terminal of a speaker in the conventional amplification method. However, in the present invention, a change can be conveniently made in the range of the maximum output of the amplifier by raising the supply voltage to make a change in the peak-to-peak voltage of the second or third sawtooth-wave and changing the power capacity of the power amplification device.

Sixthly, in order to construct a BTL circuit in the pre-existing amplification method, a two-channel amplifier is structured so that a reversed signal on one side channel output is inputted to the other amplifier, thereby worsening the distortion of signal by greater phase difference in two channels. In the present invention, however, the second and third sawtooth-waves of output level are simultaneously generated for simultaneous generation of output signals having reversed phases, thereby resulting in a simple structure thereof and small distortion due to the same phase delay of the two channels.

Seventhly, in the prior art, digital signals have been reproduced by digital devices like a CDP through D/A conversion and amplification of filtered output signals. However, in the present invention, the digital signals to be processed in a digital device are directly inputted to an amplifier of the present invention for reproduction so that distortion in D/A signal conversion is eliminated, construction of the circuit is simplified and longer-distance connection is possible without noise.

Eighthly, since the present invention has nothing to do with a characteristic of a transistor that produces undesirable effects on the output waveform, the advantageous structure of our invention can result in a superior function in a small-signal amplifier of an analog signal, power amplifier of an analog signal, speaker driving amplifier, semiconductor device having an integrated circuit and the like.

Having described the preferred embodiments and operational effects of the present invention, it is to be understood that the invention is not limited to those precise embodiments, and that various changes and modifications may be effected therein by one skilled in the art without departing from the scope or spirit of the invention as defined in the appended claims.

What is claimed is:

1. An analog signal amplifying method of an analog signal amplifier, the method comprising the steps of:

outputting a first sawtooth-wave having a frequency much larger than a maximum frequency of input signal of the amplifier, an amplitude identical to or a little larger than a maximum amplitude of the input signal and a predetermined period;

comparing the first sawtooth-wave with the input signal to output a first pulse of high level at the region where the amplitude of the first sawtooth-wave is larger than that of the input signal;

outputting a second pulse having a small width in the form of one-short type at every starting point of high level regions of the first pulse;

outputting a second sawtooth-wave having an amplitude identical to or a little larger than a maximum amplitude of output signal of the amplifier and the same period and phase as that of the first sawtooth-wave;

corresponding respective starting points of high level regions of the second pulse to the second sawtooth-wave to continuously generate an output voltage on the basis of a second sawtooth-wave voltage position where the starting points and the high level regions are corresponded with each other; and charging the generated voltage into a condenser by a high speed switch, constantly keeping the voltage charged in it and eliminating a valley to be easily filtered.

2. An analog signal amplifying method of an analog signal amplifier, the method comprising the steps of:

outputting a first sawtooth-wave having a frequency much larger than a maximum frequency of input signal of the amplifier, an amplitude identical to or a little larger than a maximum amplitude of the input signal and a predetermined period;

comparing the first sawtooth-wave with the input signal to output a first pulse of high level at the region where the amplitude of the first sawtooth-wave is larger than that of the input signal;

outputting a second pulse having a small width in the form of one-short type at every starting point of high level regions of the first pulse;

outputting a second sawtooth-wave having an amplitude identical to or a little larger than a maximum amplitude of output signal of the amplifier and the same period and phase as that of the first sawtooth-wave;

corresponding respective starting points of high level regions of the second pulse to the second sawtooth-wave to continuously generate a first output voltage on the basis of a second sawtooth-wave voltage position where the starting points and the high level regions are corresponded with each other;

outputting a third sawtooth-wave having reversed phase of the second sawtooth-wave;

corresponding the respective starting points of high level regions of the second pulse to the third sawtooth-wave to continuously generate a second output voltage on the basis of a third sawtooth-wave voltage position where the starting points and the third sawtooth-wave are corresponded with each other;

charging the generated the first and second voltages into a condenser by an analog switch, constantly keeping the voltage charged in it and eliminating valleys of output waveforms to be easily filtered; and obtaining a double magnitude of output signal by combining the absolute value of the first and second output voltages.

3. The method, as defined in claim 1 or 2, further comprising a step of controlling the amplitude of the first sawtooth-wave to adjust gain of the amplifier.

4. A semiconductor-integrated amplifying device using the method of claim 3.

5. The method, as defined in claim 1 or 2, further comprising a step of modulating amplitude of the input signal by adjusting the amplitude of the first sawtooth-wave by using a second input signal apart from the input signal.

6. A semiconductor-integrated amplifying device using the method of claim 5.

7. A semiconductor-integrated amplifying device using the method defined in claim 1 or 2.

8. A sawtooth-wave generating circuit used for an analog signal amplifying circuit, the circuit comprising:

a clock generator (7-A) for generating clocks;

a second sawtooth-wave generator (7-B) for making pulses generated from the clock generator (7-A) into positive and negative pulse, obtaining a continuous second sawtooth-wave of output signal level by driving a condenser (C3) discharging circuit (Q1) of output voltage level with the positive pulse and resetting the second sawtooth-wave at every positive pulse and finally generating an input signal level of a first sawtooth-wave by using the second sawtooth-wave; and a third sawtooth-wave generator (7-C) for reducing an output impedance of the second sawtooth-wave by a first buffer circuit (Q3) and simultaneously driving an output voltage level of a condenser (C5) discharging circuit (Q4) With the negative pulse generated from the clock generator to reset the sawtooth-wave at every negative pulse and finally obtaining a continuous third sawtooth-wave, and wherein the third sawtooth-wave is outputted in the form of a lower output impedance reduced by a second buffer circuit (Q6) to thereby generate two sawtooth-waves having same periods and different phases reversed oppositely with each other.

9. The circuit, as defined in claim 8, wherein the second sawtooth-wave voltage of the output voltage level generated from the second sawtooth-wave generator (7-B) is damped to generate the first sawtooth-wave of input signal voltage level having the same phases and periods.

10. The circuit, as defined in claim 8, further comprising a positive pulse circuit (IC2A) connected with an output of the clock generator (7-A) to output the positive pulse and a negative pulse circuit (IC2B) connected with the positive pulse to output the negative pulse having a reversed phase with respect to that of the positive pulse, where a condenser (C2) connects an output of the positive pulse circuit (IC2A) with condenser discharging circuits Q1, D1, R4 that constructs a CLAMP circuit in the second sawtooth-wave generator (7-B); and a condenser (C4) connects an output of the negative pulse circuit (IC2B) with condenser discharging circuits Q4, D2, R10 that constructs a CLAMP circuit in the third sawtooth-wave generator (7-C) to thereby make the supply voltage (+−V2) of the second and third sawtooth-wave generator (7-B, 7-C) variable to conveniently change the maximum output of the amplifier.

11. A sawtooth-wave generating circuit used for an analog signal amplifying circuit, the circuit comprising:

a clock generator (7-A) for generating clocks;

a second sawtooth-wave generator (7-B) for generating a second sawtooth-wave of output signal level by using clocks of the clock generator (7-A) and, simultaneously, generating a first sawtooth-wave of input signal level by using the second sawtooth-wave;

a third sawtooth-wave generator (7-C) for generating a third sawtooth-wave of output signal level having a reversed phase with respect to that of the second sawtooth-wave generated from the second sawtooth-wave generator (7-B);

a comparator circuit (7-D) having an input terminal IN and a comparator (IC3), the comparator (IC3) comparing the first sawtooth-wave generated from the second sawtooth-wave generator (7-B) with an analog signal inputted from the input terminal IN and for generating a first pulse of high level if the first sawtooth-wave signal is higher than the analog input signal;

one-shot vibrator (7-F) for regularly shaping the first pulse generated from the comparator circuit (7-D) to generate a second pulse having a narrower width than that of the first pulse; and an analog switch circuit (7-E) for generating the first output (P-OUT) as an analog output having a phase identical to that of the input signal by using the second and third sawtooth-waves respectively generated from the second and third sawtooth-wave generators and a second output (N-OUT) as an analog output having phase opposite to that of the input signal.

12. The circuit, as defined in claim 11, wherein the analog switch circuit 7-E comprises:

an analog switch 1 (A-SW1) for inputting the second sawtooth-wave signal PTH of an output level having the same phase as that of the input signal;

an analog switch 2 (A-SW2) for inputting the third sawtooth-wave signal NTH of an output level having a reversed phase with respect to that of the input signal;

first ripple offset means having a condenser (C10) connected to the output terminal of the analog switch 1 (A-SW1) and the first voltage-dividing means (TC2, C8) for voltage-dividing the third sawtooth-wave (NTH) to dampen and remove ripples by overlapping the voltage-divided signal at the condenser (C10); and second ripple offset means having a condenser (C13) connected to the output terminal of the analog switch 2 (A-SW2) and the second voltage-dividing means (TC1, C9) for voltage-dividing the second sawtooth-wave (PTH) to dampen and remove ripples by overlapping the voltage-divided signal at the condenser (C13).

13. The circuit defined in claim 11, where a power amplifying element (CBST1) connected with the first output of the circuit via a low pass filter (LPF1) controls the output terminal (OUT) of the power amplifier to be at an electric potential of 0 V at all times by letting the output terminal OUT and an inverting input terminal (−) of operational amplifier IC30 be connected through a resistor (R31), condenser (C31) be connected on a path that connects the inverting terminal (−) of operational amplifier IC30 with the output terminal of operational amplifier IC30 and resistor (R30) be connected between the output terminal of the operational amplifier (IC30) and the base of transistor (Q30), and feeding back DC component at a high time constant of the resistor R31 and condenser C31.

14. The circuit, as defined in claim 11, wherein, in case that the first pulse is formed regularly into the second pulse in the one-shot vibrator 7-F, the delay time (TpIh) between the input and output of the one-shot vibrator 7-F occurs during the time point from the highest point to the lowest point in the second sawtooth-waves, blanking pulses of high level advanced in time by said delay time (Tplh) from said time point are applied to the reset terminal (RESET) of the one-shot vibrator IC4 to prevent the output of the second pulse and the sudden inversion of output voltage upon inputting of the first pulse close to the maximum value of the input signal.

15. The circuit, as defined in claim 11, wherein, if there is a delay time delayed from the time point of generating the first pulse being an output of a comparator IC3 produced by the first sawtooth-wave of an input signal level and an input signal of the input terminal IN to the time point of outputting the second pulse width being formed regularly in the one-shot vibrator IC4, the output extracted from the analog switch circuit 7-E is corrected to the maximum output voltage having no distortion by delaying the sawtooth-wave driving pulse by said delay time and generating an output level of the sawtooth-wave with the delayed drive pulse.

16. An amplifier for inputting a PWM signal, the amplifier including:
   a rising region detector (9-B) for generating a high pulse at a rising region of the PWM signal by detecting the rising region of the PWM signal;
   a falling region detector (9-C) for generating a high pulse at a falling region of the PWM signal by detecting the falling region of the PWM signal;
   a sawtooth-wave generator (9-D) for generating a sawtooth-wave of output level by initializing with the high pulse of the rising region detector;
   one-shot vibrator (9-E) for regularly forming the high pulse of the falling region detector into a narrower pulse; and
   a switching circuit (9-F) for being turned on by the narrow pulse shaped in the one-shot vibrator (9-E) and charging a condenser with sawtooth-wave voltage from the sawtooth-wave generator (9-D), to thereby generate a continuous and smooth analog signal.

17. A semiconductor integrated amplifying element having the amplifier defined in claim 16.

18. An amplifier for inputting a digital signal from a digital signal outputting device that processes an analog signal and outputs digital data, the amplifier comprising:
   a digital data controlling and processing unit (13-B) for analyzing the digital data including a right signal, left signal, and control signal to output the analyzed signals as control signals;
   a storage comparator (13-C) for storing and comparing the control signals generated from the digital data controlling and processing unit (13-B) to output a high pulse corresponding to an analog signal value;
   a one-shot vibrator (13-E) for shaping a narrow pulse at a starting time of a high pulse from the storage comparator (13-C);
   a sawtooth-wave generating and resetting circuit (13-D) for generating and resetting a sawtooth-wave by a high pulse output with a data starting signal generated from the digital data controlling and processing unit (13-B); and
   an analog switch (13-F) for generating a continuous right and left smoothing analog signal by controlling the narrower pulse shaped in the one-shot vibrator (13-E), utilizing the sawtooth-wave of the sawtooth-wave generating and resetting circuit (13-D), extracting a voltage corresponding to the sawtooth-wave and charging and maintaining the voltage at condensers C54, C56.

19. A semiconductor integrated amplifying element having the amplifier defined in claim 18.

20. An amplifier comprising:
   sawtooth-wave generating means for generating a first sawtooth-wave having a frequency and amplitude greater than those of an input signal and the second sawtooth-wave having a frequency identical to that of the first sawtooth-wave and amplitude greater than that of the first sawtooth-wave; and
   comparison means for comparing the voltage values of the input signal with the first sawtooth-wave and outputting voltage signal of high level at the region where the voltage value of the first sawtooth-wave is greater than that of the input signal; and
   sample/hold means for detecting and maintaining a voltage value of the second sawtooth-wave when the voltage signal of high level is started at the comparison means.

21. An amplifier comprising:
   edge detecting means for detecting rising and falling edges of pulse width modulation signal;
   sawtooth-wave generating means for generating a sawtooth-wave having a period identical to that of the rising edge;
   sample/hold means for detecting and maintaining a voltage value of the sawtooth-wave at its falling edge.

22. An amplifier comprising:
   sawtooth-wave generating means for generating sawtooth-wave having a period identical to that of data included in a pulse code modulation signal;
   comparison means for comparing a value of data included in the pulse code modulation signal with a counted value produced by counting a predetermined period of a clock signal and outputting a high level of a voltage signal if said counted value is greater than that of data; and
   sample/hold means for detecting and maintaining a voltage value of the sawtooth-wave when the voltage signal of high level is started at the comparison means.

* * * * *